(12) United States Patent
Sakurai et al.

(10) Patent No.: US 11,445,600 B2
(45) Date of Patent: Sep. 13, 2022

(54) INTERLAYER REGION HAVING A SIGNAL VIA FOR COUPLING BETWEEN PLANAR SIGNAL LINES, WHERE A MULTI-MODE SIGNAL PROPAGATES THROUGH THE INTERLAYER REGION

(71) Applicants: SOKEN, INC., Nisshin (JP); DENSO CORPORATION, Kariya (JP)

(72) Inventors: Kazumasa Sakurai, Nisshin (JP); Kazuya Wakita, Kariya (JP); Yuuji Kakuya, Nisshin (JP)

(73) Assignees: SOKEN, INC., Nisshin (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/855,375

(22) Filed: Apr. 22, 2020

(65) Prior Publication Data
US 2020/0251798 A1 Aug. 6, 2020

Related U.S. Application Data

(63) Continuation of application No. PCT/JP2018/039197, filed on Oct. 22, 2018.

(30) Foreign Application Priority Data

Oct. 25, 2017 (JP) .............................. JP2017-206232

(51) Int. Cl.
| | | |
|---|---|---|
| *H05K 1/02* | (2006.01) | |
| *H01P 3/08* | (2006.01) | |
| *H01P 3/12* | (2006.01) | |
| *H01P 5/02* | (2006.01) | |
| *H01P 5/08* | (2006.01) | |

(52) U.S. Cl.
CPC ............ *H05K 1/0251* (2013.01); *H01P 3/082* (2013.01); *H01P 3/088* (2013.01); *H01P 3/121* (2013.01); *H01P 5/028* (2013.01); *H01P 5/085* (2013.01)

(58) Field of Classification Search
CPC .......... H01P 1/047; H01P 5/028; H01P 3/088; H01P 3/082; H01P 5/085; H05K 1/0251

USPC ........................................................ 333/246
See application file for complete search history.

(56) References Cited

U.S. PATENT DOCUMENTS

| | | | | |
|---|---|---|---|---|
| 4,494,083 A | * | 1/1985 | Josefsson et al. ....... | H01P 3/085 333/238 |
| 6,700,789 B2 | * | 3/2004 | Shirasaki ................ | H01P 1/047 174/255 |
| 2011/0241803 A1 | * | 10/2011 | Tsukashima ............ | H01P 3/003 333/238 |

FOREIGN PATENT DOCUMENTS

JP 2015-050680 A 3/2015

OTHER PUBLICATIONS

Li, Zhipeng et al., Analysis of Wideband Multilayer LTCC Vertical Via Transition for Millimeter-wave System-in-package, Institute of Electronic Engineering China Academy of Engineering Physics, 2017 18th International Conference on Electronic Packaging Technology, 2017, pp. 1039-1042.

* cited by examiner

*Primary Examiner* — Benny T Lee
(74) *Attorney, Agent, or Firm* — Maschoff Brennan

(57) ABSTRACT

A signal via has a via diameter that causes a high-frequency signal to be propagated through a high-frequency transmission line causing multi mode propagation (multi-mode interference propagation). At least one of the inter-via distance between the signal via and respective ground vias, the via diameter, and the thickness of the multilayer substrate is determined to introduce the high-frequency signal from the interlayer transmission line to the signal lines in the high-intensity region of the multi mode propagation.

10 Claims, 30 Drawing Sheets

SINGLE MODE PROPAGATION
VIA DIAMETER 0.15mm

PRIOR ART

PRIOR ART

PRIOR ART

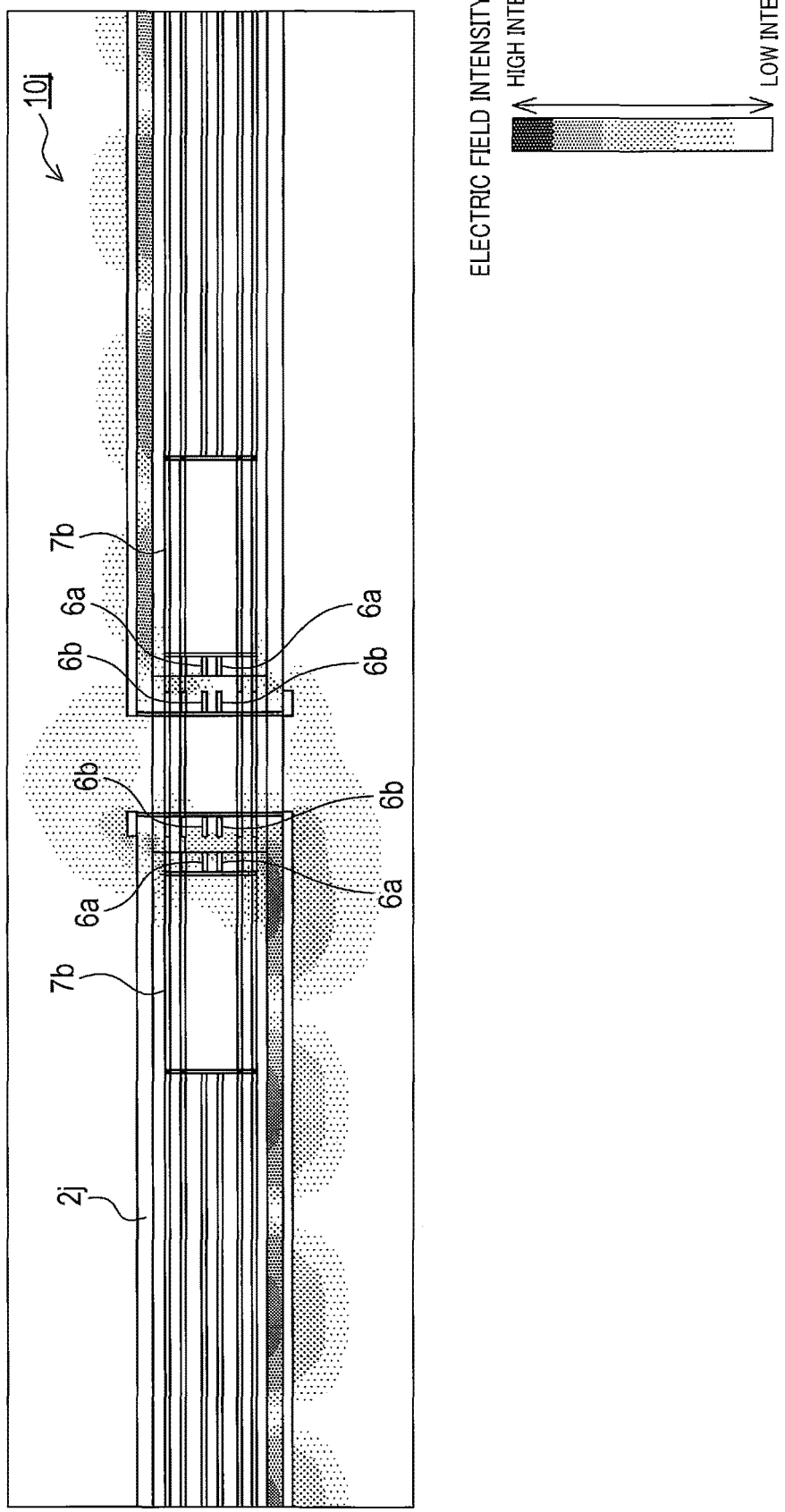

though an interlayer transmission line between the signal via and the ground vias. The signal via has a via diameter that causes multi mode propagation of the high-frequency signal in the interlayer transmission region. Multi mode propagation of the high-frequency signal forms, in the transmission direction, a high-intensity region having a high electric field intensity and a low-intensity region having a low electric field intensity. At least one of the inter-via distance between the signal via and respective ground vias, the via diameter, and the thickness of the multilayer substrate is determined to introduce the high-frequency signal from the interlayer transmission line to the signal lines in the high-intensity region of the multi mode propagation.
INTERLAYER REGION HAVING A SIGNAL VIA FOR COUPLING BETWEEN PLANAR SIGNAL LINES, WHERE A MULTI-MODE SIGNAL PROPAGATES THROUGH THE INTERLAYER REGION

CROSS-REFERENCE TO RELATED APPLICATION

The present application is a continuation application of International Application No. PCT/JP2018/039197, filed Oct. 22, 2018, which claims priority to Japanese Patent Application No. 2017-206232, filed Oct. 25, 2017. The contents of these applications are incorporated herein by reference in their entirety.

BACKGROUND

1. Technical Field

The disclosure relates to a technique for transmitting a high-frequency signal through a multilayer substrate in a layer stacking direction.

2. Related Art

Known techniques related to a high-frequency transmission line include a technique for forming a high-frequency transmission line having a coaxial line structure including a signal via coupling signal-line patterns formed on two sides of a multilayer wire substrate and ground vias disposed along a circle around the signal via and having a ground potential.

SUMMARY

The present disclosure provides a high-frequency transmission line. As an aspect of the present disclosure, a high-frequency transmission line includes a multilayer substrate, signal lines, a signal via, at least one ground plane, and a plurality of ground vias. The multilayer substrate includes a plurality of dielectric layers stacked on each other. The signal lines are formed on the two outer faces of the multilayer substrate. The signal via couples the signal lines formed on the two outer faces. The ground plane is disposed between the dielectric layers, is included in the multilayer substate, and covers the surrounding area of a removed region around the signal via. The ground vias penetrate at least one of the dielectric layers in the layer stacking direction, are disposed around the signal via, and are electrically coupled to the ground plane. An interlayer transmission line that transmits the high-frequency signal in the layer stacking direction is formed between the signal via and the ground vias. The signal via has a via diameter that causes multi mode propagation of the high-frequency signal in the interlayer transmission region. Multi mode propagation of the high-frequency signal forms, in the transmission direction, a high-intensity region having a high electric field intensity and a low-intensity region having a low electric field intensity. At least one of the inter-via distance between the signal via and respective ground vias, the via diameter, and the thickness of the multilayer substrate is determined to introduce the high-frequency signal from the interlayer transmission line to the signal lines in the high-intensity region of the multi mode propagation.

BRIEF DESCRIPTION OF THE DRAWINGS

In the accompanying drawings, where like features are denoted by the same reference label throughout the drawings:

FIG. 32 is a cross section view in a thickness direction showing an electric field distribution in a high-frequency transmission line according to a fourth embodiment.

DETAILED DESCRIPTION OF THE PREFERRED EMBODIMENTS

Figure 1:
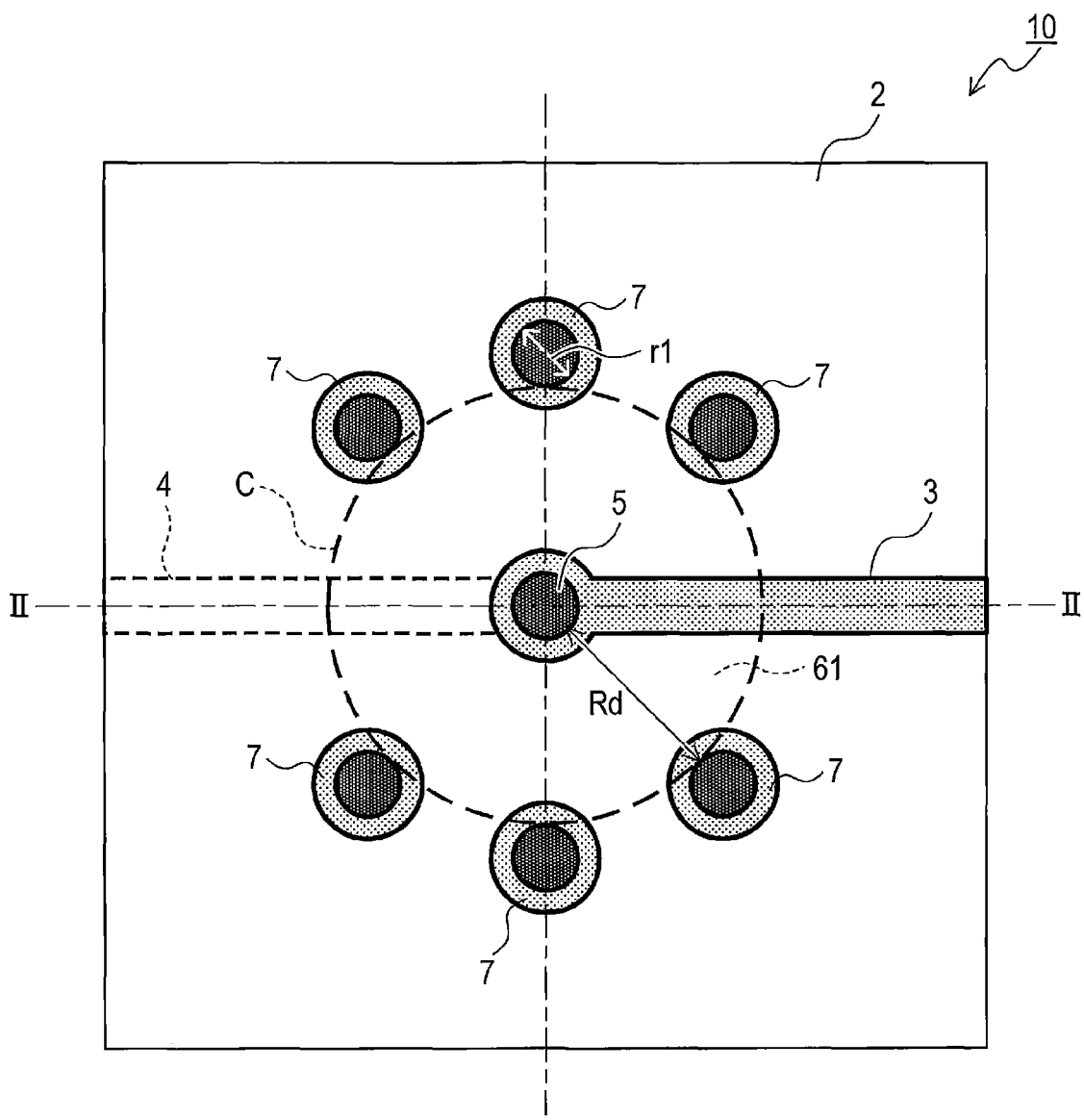
FIG. 1 is a plan view of a high-frequency transmission line according to a first example of a first embodiment.

JP 2015-50680 A describes a technique for forming a high-frequency transmission line having a coaxial line structure including a signal via coupling signal-line patterns formed on two sides of a multilayer wire substrate and ground vias disposed along a circle around the signal via and having a ground potential.

In a high-frequency transmission line having a coaxial line structure, a signal is transmitted causing single mode propagation of the signal so as to suppress a transmission loss. To achieve single mode propagation in the high-frequency transmission line, the via diameter of the signal via, and the like, needs to be decreased with an increase in the frequency of the transmitted signal. Through detailed examination, the inventor has discovered a problem in that, when a high-frequency transmission line, such as that described above, is used for single mode propagation of a high-frequency signal, the via diameter of the signal via, and the like, needs to be relatively small, and thus, it is difficult to mass-produce the high-frequency transmission line.

According to one aspect of the disclosure, it is desirable to provide a mass-producible high-frequency transmission line that can reduce the transmission loss.

One aspect of the disclosure includes a multilayer substrate, signal lines, a signal via, at least one ground plane, and a plurality of ground vias. The multilayer substrate includes a plurality of dielectric layers stacked on each other. The signal lines are formed on the two outer faces of the multilayer substrate. The signal via couples the signal lines formed on the two outer faces. The ground plane is disposed between the dielectric layers, is included in the multilayer substate, and covers the surrounding area of a removed region around the signal via. The ground vias penetrate at least one of the dielectric layers in the layer stacking direction, are disposed around the signal via, and are electrically coupled to the ground plane. An interlayer transmission line that transmits the high-frequency signal in the layer stacking direction is formed between the signal via and the ground vias. The signal via has a via diameter that causes multi mode propagation of the high-frequency signal through the interlayer transmission line. Multi mode propagation forms, in the transmission direction, a high-intensity region having a high electric field intensity and a low-intensity region having a low electric field intensity. At least one of the inter-via distance between the signal via and respective ground vias, the via diameter, and the thickness of the multilayer substrate is determined to introduce or couple the high-frequency signal from the interlayer transmission line to the signal lines in the high-intensity region of the multi mode propagation.

According to one aspect of the disclosure, the signal via has a via diameter that causes multi mode propagation of the high-frequency signal through the interlayer transmission line. That is, the signal via is formed to have a via diameter that is larger than a via diameter that causes single mode propagation of the high-frequency signal to be propagated through the interlayer transmission line. Therefore, the high-frequency transmission line can be mass-produced.

In general, the transmission loss is greater in multi mode propagation than in single mode propagation. However, the electric field distribution in the input portion of the high-frequency transmission line can be reproduced in the output portion of the high-frequency transmission line by appropriately adjusting the high-frequency transmission line, and thereby the transmission loss can be suppressed. At least one of the inter-via distance, the via diameter, and the substrate thickness of the high-frequency transmission line is determined such that the high-frequency signal enters from the interlayer transmission line to the signal lines in the high-intensity region of the electric field. This suppresses the transmission loss during propagation of the high-frequency signal through the interlayer transmission line. Therefore, a mass-producible high-frequency transmission line that can suppress a transmission loss can be realized.

Example embodiments of the disclosure will now be described with reference to the drawings.

1. FIRST EMBODIMENT

1-1. First Example

<1-1-1. Configuration>

A high-frequency transmission line according to the disclosure is used for the transmission of high-frequency signals, in particular, high-frequency signals having a frequency of 70 GHz or higher, and specifically, is used for feeding electrical power to an antenna.

The configuration of a high-frequency transmission line 10 according to a first example of a first embodiment will now be described with reference to FIGS. 1 and 2. The high-frequency transmission line 10 includes a multilayer substrate 2, signal lines 3 and 4, a signal via 5, and six through vias 7.

Figure 2:
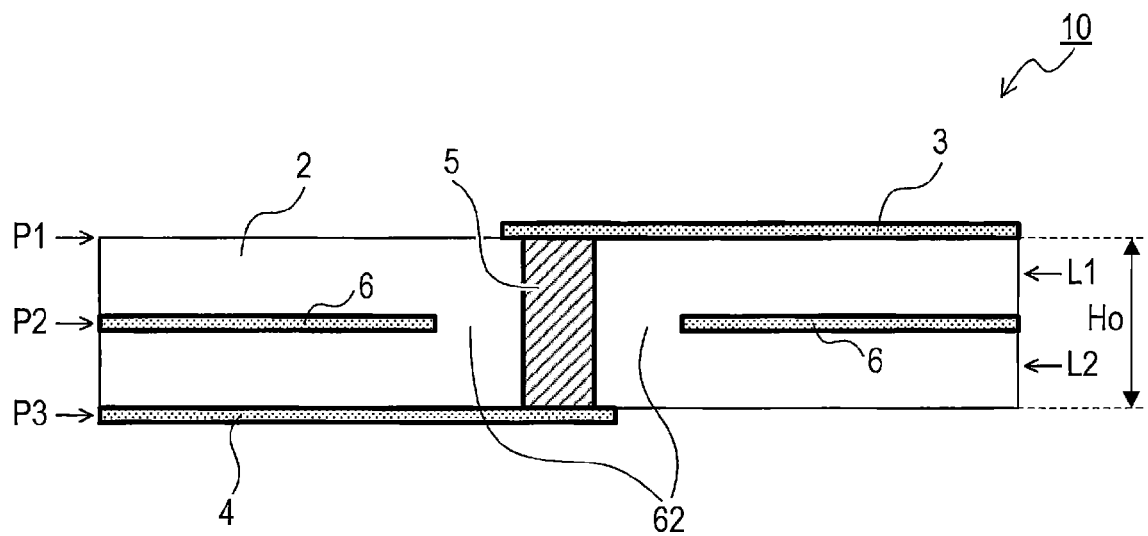
FIG. 2 is a cross section view taken along line II-II in FIG. 1.

As shown in FIG. 2, the multilayer substrate 2 includes two dielectric layers L1 and L2, and three pattern layers P1, P2 and P3 sandwiching the dielectric layers L1 and L2. Hereinafter, the pattern layers P1 and P3 disposed on the outer faces of the multilayer substrate 2, among the pattern layers P1, P2 and P3, are referred to as "outer layers", and the pattern layer P2 disposed between the dielectric layers L1 and L2 is referred to as an "intermediate layer".

On the outer layers P1 and P3, the signal line 3 and 4 are respectively formed to serve as waveguides for the transmission of high-frequency signals. The signal line 3 is a conductive pattern formed on the outer layer P1, and the signal line 4 is a conductive pattern formed on the outer layer P3. The signal lines 3 and 4 are made of, for example, copper foil deposited by etching. The tip portions of the signal lines 3 and 4 are disposed at positions facing each other across the two dielectric layers L1 and L2 and mutually coupled with each other through the signal via 5 penetrating the multilayer substrate 2. The signal via 5 is a metal conductor.

A ground plane 6 is formed in the intermediate layer P2. The ground plane 6 is a conductive pattern formed in the intermediate layer P2 with copper foil or the like, and is coupled to a ground potential. The ground plane 6 covers the entire contact face of the dielectric layer L1 and the dielectric layer L2 except for a removed region 61. The removed region 61 is a circular region around the signal via. In other words, the signal via 5 is not electrically coupled to the ground plane 6.

The six through vias 7 is a metal conductor that penetrate the multilayer substrate 2 in the layer stacking direction and are electrically coupled to the ground plane 6. That is, the through vias 7 are ground vias. Hereinafter, the through vias 7 are also referred to as "ground vias 7". In this embodiment, the via diameter of each through via 7 is the same as the via diameter r1 (FIG. 1) of the signal via 5. The six through vias 7 are disposed along the circumference of a circle C around the signal via 5 such that the through holes of the through vias 7 are externally tangent to the circle C. An interlayer transmission line 62 for the transmission of a high-frequency signal in the layer stacking direction is formed between the signal via 5 and the six through vias 7. The cross-section of the interlayer transmission line 62 along a direction orthogonal to the layer stacking direction has an annular shape, i.e., so-called "donut shape" defined by two concentric circles.

As shown in FIG. 1, the circle C is defined by the outer circumferential edge of the removed region 61. The radius plurality of of the circle C is determined such that the position of an external conductor of a coaxial line including the signal via 5 as an internal conductor coincides with the circle C. In this way, the high-frequency transmission line 10 is provided with a quasi coaxial line including the signal via 5 serving as the internal conductor and the six through vias 7 serving as the external conductor. The radius of the circle C is determined on the basis of the frequency of the high-frequency signal propagating through the interlayer transmission line 62, the impedance of the interlayer transmission line 62, the permittivity of the dielectric layers L1 and L2, and the like.

<1-1-2. Transmission Mode>

Figure 3:
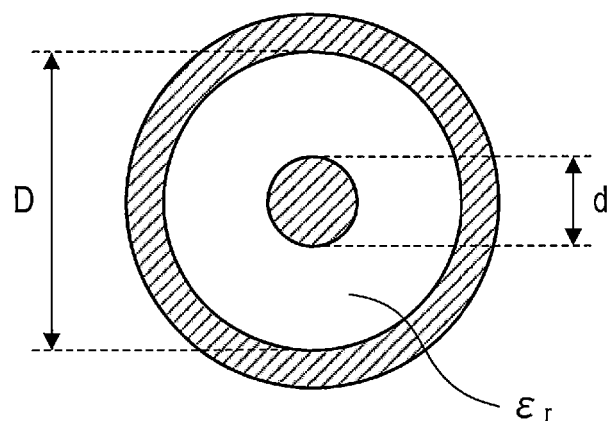
FIG. 3 is a schematic cross section view of a coaxial line.

The transmission mode of the coaxial line will now be described. FIG. 3 is a schematic view of the coaxial line. As illustrated in FIG. 3, the critical frequency fc of the coaxial line is determined from expression (1). In expression (1), d is the outer diameter of the internal conductor, D is the inner diameter of the external conductor, sr is the relative permittivity of the dielectric bodies between the internal conductor and the outer conductor, and c is the speed of light.

[Expression 1]

$$f_c = \frac{c}{\pi\sqrt{\varepsilon_r}\frac{D+d}{2}} \quad (1)$$

Figure 4:
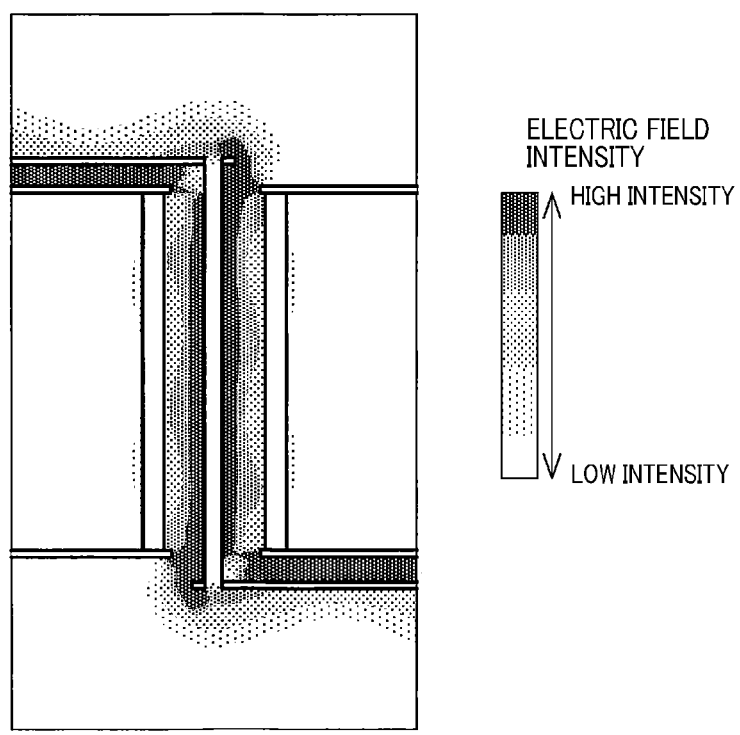
FIG. 4 is a cross section view in a thickness direction showing an electric field distribution in a high-frequency transmission line when a signal propagates in a thickness direction causing single mode propagation.

A signal having a frequency lower than or equal to the critical frequency fc propagates through the coaxial line by single mode propagation. In single mode propagation, a signal is transmitted only in a transverse electromagnetic (TE) mode, which is the base mode. FIG. 4 illustrates the electric field intensity distribution for when a high-frequency signal causes single mode propagation through the interlayer transmission line. When the frequency of the high-frequency signal is the critical frequency fc or lower, a high-intensity region having a high electric field intensity is formed near the signal via continuously along the layer stacking direction, as illustrated in FIG. 4. Thus, the transmission loss is suppressed in the connecting portions of the waveguide and the interlayer transmission line, specifically, the output portions from the interlayer transmission line to the signal line.

However, as in expression (1), to increase the critical frequency fc, the outer diameter d or the inner diameter D needs to be decreased. In view of reliability, the inner diameter D, that is, the inter-via distance Rd between the sidewall of the signal via and the sidewall of each ground via needs to be relatively large so that the signal via and the ground vias are not electrically coupled. Therefore, to increase the critical frequency fc, the inter-via distance Rd is set to a predetermined value, and the outer diameter d, that is, the via diameter r1 of the signal via is decreased. When a 77-GHz high-frequency signal is to be transmitted, the critical frequency fc needs to be higher than or equal to 81 GHz or the maximum frequency of the 77-GHz band. To achieve a critical frequency fc higher than or equal to 81 GHz, the via diameter r1 needs to be 0.2 mm or less. In the example illustrated in FIG. 4, the via diameter r1 is 0.15 mm.

However, when the via diameter r1 is too small, it is difficult to mass-produce the high-frequency transmission lines. To enable mass-production of the high-frequency transmission lines, it is desirable to set the via diameter r1 to 0.3 mm or more. That is, when the high-frequency transmission line used for transmission of a 77-GHz high-frequency signal has a size that enables mass-production, the interlayer transmission line does not satisfy the condition for causing single mode propagation. Thus, multiple higher-order modes, in addition to the base mode, are excited in the interlayer transmission line. The high-frequency signal then propagates through the interlayer transmission line while resonating between the excited modes. That is, the high-frequency signal propagates through the interlayer transmission line causing multi mode propagation (multi-mode interference propagation).

Figure 5:
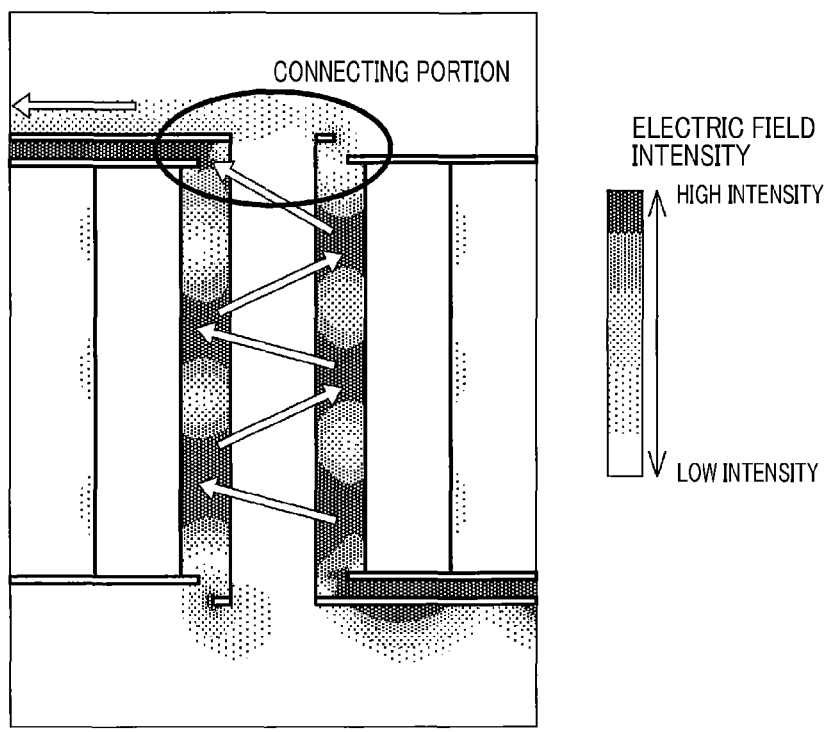
FIG. 5 is a cross section view in a thickness direction showing an electric field distribution in a high-frequency transmission line when a signal propagates by multi mode propagation.

When the high-frequency signal propagates through the interlayer transmission line by multi mode propagation, high-intensity regions having a high electric field intensity and low-intensity regions having a low electric field intensity lower than that in the high-intensity region are formed in the transmission direction. FIG. 5 illustrates the electric field intensity distribution when the via diameter is 0.7 mm, and when a high-frequency signal is transmitted through the an interlayer transmission line causing multi mode propagation (multi-mode interference propagation). As illustrated in FIG. 5, the high-intensity regions and the low-intensity regions are alternately formed in the interlayer transmission along the transmission direction. When a low-intensity region is formed in the output portion of the interlayer transmission line, the transmission loss increases, whereas, when a high-intensity region is formed at the output portion, the transmission loss is suppressed. In the multi mode propagation, the mode of the input portion from the signal line to the interlayer transmission line can be reproduced in the output portion from the interlayer transmission line to the signal line by adjusting the length and width of the interlayer transmission line. That is, a high-intensity region can be formed in the output portion from the interlayer transmission line to the signal line.

Therefore, in this embodiment, the via diameter r1 of the signal via 5 of the high-frequency transmission line 10 is set to a value that enables mass-production, that is, enables propagation by multi mode propagation (multi-mode interference propagation). Furthermore, in this embodiment, at least one of the substrate thickness Ho of the multilayer substrate 2 (illustrated in, for example, FIG. 2), the inter-via distance Rd, and the via diameter r1 is designed to introduce the high-frequency signal from the interlayer transmission line 62 to the signal line 4 in the high-intensity region of the electric field. Hereinafter, the adjustment of at least one of the substrate thickness Ho of the multilayer substrate, the inter-via distance Rd, and the via diameter r1 to introduce the high-frequency signal from the interlayer transmission line 62 to the signal line 4 in the high-intensity region of the electric field is referred to as "electric field distribution adjustment".

<1-1-3. Analytical Result>

Figure 6:
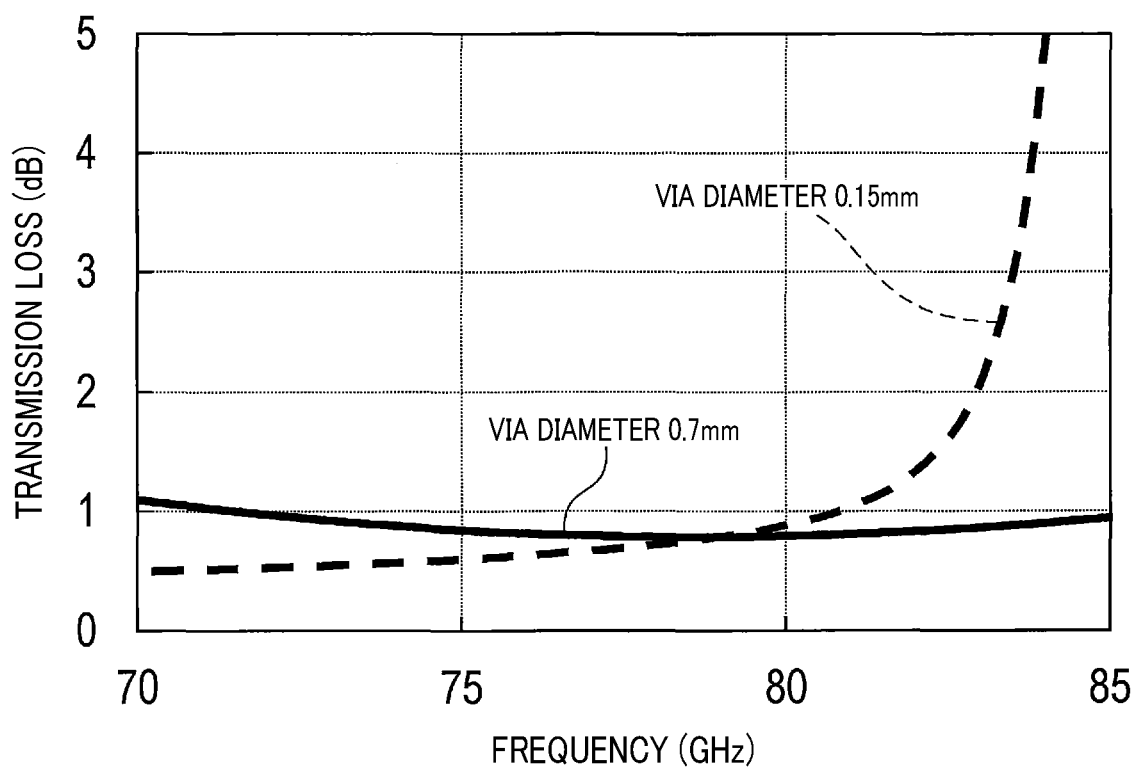
FIG. 6 illustrates the transmission loss corresponding to a frequency in single mode propagation and multi mode propagation via a coaxial line.

FIG. 6 illustrates the transmission loss in dB corresponding to a frequency in GHz for a case in which the via diameter r1 is 0.15 mm and a case in which the electric field distribution adjustment is performed to obtain a via diameter of 0.7 mm. As illustrated in FIG. 6, when the via diameter r1 is 0.15 mm and the frequency is within the range of 70 to 80 GHz, the transmission loss is lower than that of when the via diameter is 0.7 mm. However, the transmission loss suddenly increases when the frequency exceeds 80 GHz.

This indicates that, when the via diameter is 0.15 mm, the interlayer transmission line satisfies the single mode condition within a frequency range of 70 to 80 GHz, but does not satisfy the single mode condition when the frequency exceeds 80 GHz. That is, when the via diameter r1 is 0.15 mm, the high-frequency signal exceeding a frequency of 80 GHz is propagated through the interlayer transmission line causing the multi mode propagation. However, the transmission loss suddenly increases because the electric field distribution is not adjusted. When the via diameter is 0.7 mm and the electric field distribution is adjusted, the transmission loss is suppressed to approximately 1 dB or less within a frequency range of 70 to 80 GHz, and thereby a satisfactory transmission loss is achieved.

1-2. Second Example

Figure 7:
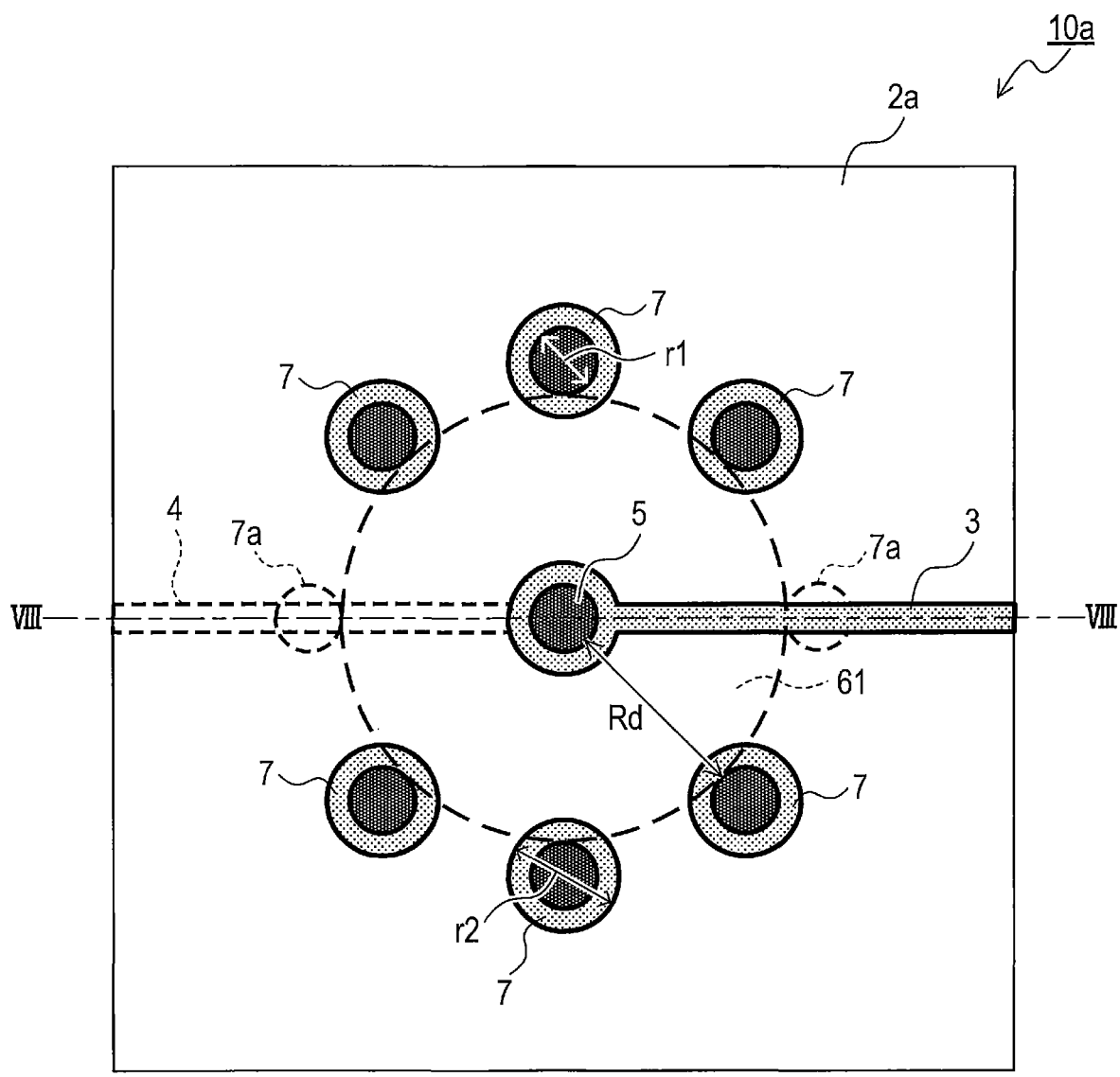
FIG. 7 is a plan view of a high-frequency transmission line according to a second example of a first embodiment.
Figure 8:
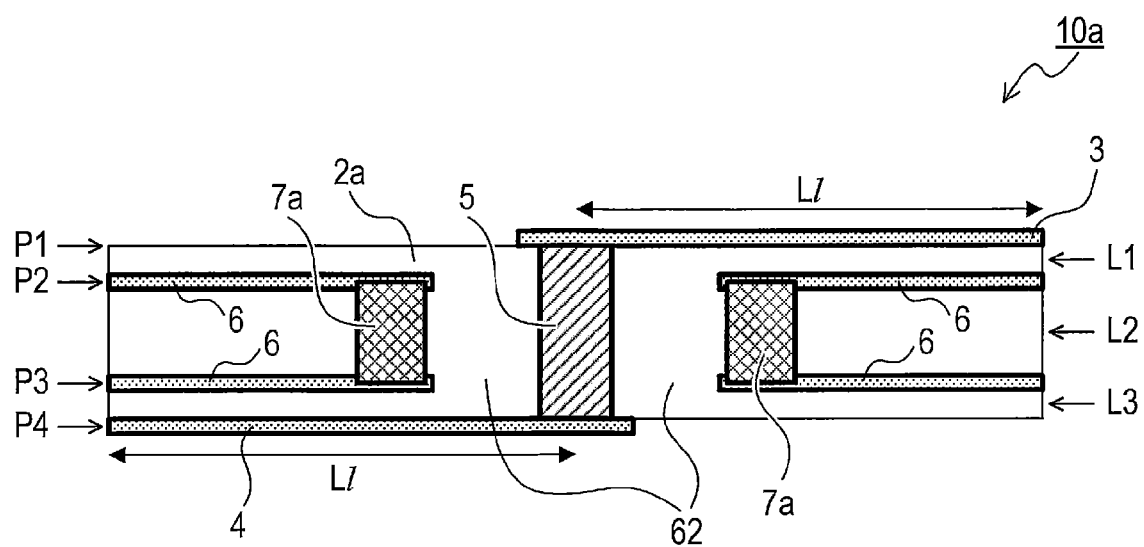
FIG. 8 is a cross section view taken along line VIII-VIII in FIG. 7.

A high-frequency transmission line 10a according to a second example of the first embodiment will now be described with reference to FIGS. 7 and 8. The high-frequency transmission line 10a includes a multilayer substrate 2a, signal lines 3 and 4, a signal via 5, six through vias 7, and two interlayer vias 7a.

The multilayer substrate 2a includes three dielectric layers L1, L2 and L3 and four pattern layers P1, P2, P3 and P4 sandwiching the dielectric layers L1, L2 and L3. Hereinafter, the pattern layers P1 and P4 disposed on the outer faces of the multilayer substrate 2a, among the pattern layers P1, P2, P3 and P4, are referred to as "outer layers", and the other pattern layers P2 and P3 are referred to as "intermediate layers".

The signal line 3 and 4 are respectively formed on the outer layers P1 and P4. Ground planes 6 are formed in the intermediate layers P2 and P3. The two interlayer vias 7a are formed in the multilayer substrate 2a. The two interlayer vias 7a penetrate the dielectric layer L2, which is a dielectric layer among the three dielectric layers L1, L2 and L3 other than those on which the signal lines 3 and 4 are formed, and electrically couple the two ground planes 6 formed in the intermediate layers P2 and P3 to each other. That is, the interlayer vias 7a are ground vias formed inside the layers. Thus, the ground vias of the high-frequency transmission line 10a include the six through vias 7 and the two interlayer vias 7a. Hereinafter, the interlayer vias 7a are also referred to as "ground vias 7a".

One of the two interlayer vias 7a is disposed at a position overlapping the signal line 3 in the layer stacking direction, and the other interlayer vias 7a is disposed at a position overlapping the signal line 4. That is, the interlayer vias 7a are formed at positions that do not penetrate the multilayer substrate 2a because the signal lines 3 and 4 are formed on the outer layers P1 and P4, respectively.

Therefore, the high-frequency transmission line 10a, which has the same configuration as that of the high-frequency transmission line 10 except for the two additional interlayer vias 7a serving as ground vias, can decrease the transmission loss by more than the high-frequency transmission line 10.

In the high-frequency transmission line 10a, for example, the substrate thickness Ho (for example in FIG. 2) may be 1 mm, the length L1 from the center of the signal via 5 to the end of each of the signal lines 3 and 4 may be 4.5 mm, the thicknesses of the dielectric layers L1, L2, and L3 may respectively be 0.1 mm, 0.8 mm, and 0.1 mm, the via diameter r1 of the signal via 5, the through vias 7, and the interlayer vias 7a may be 0.7 mm, the land diameter r2 of the signal via 5 and the through vias 7 may be 0.95 mm, and the width of the signal lines 3 and 4 may be 0.3 mm.

Note that, the two interlayer vias 7a may penetrate, in the layer stacking direction, the outer layers on the sides in which the intermediate layers and the signal lines 3 and 4 are not coupled, and may be exposed at the corresponding outer faces of the multilayer substrate 2a. That is, the interlayer via 7a disposed at a position overlapping the signal line 3, among the two interlayer vias 7a, may penetrate the dielectric layers L2 and L3 and be exposed at the outer layer P4. The interlayer via 7a disposed at a position overlapping the signal line 4, among the two interlayer vias 7a, may penetrate the dielectric layers L2 and L1 and be exposed at the outer layer P1.

1-3. Third Example

Figure 9:
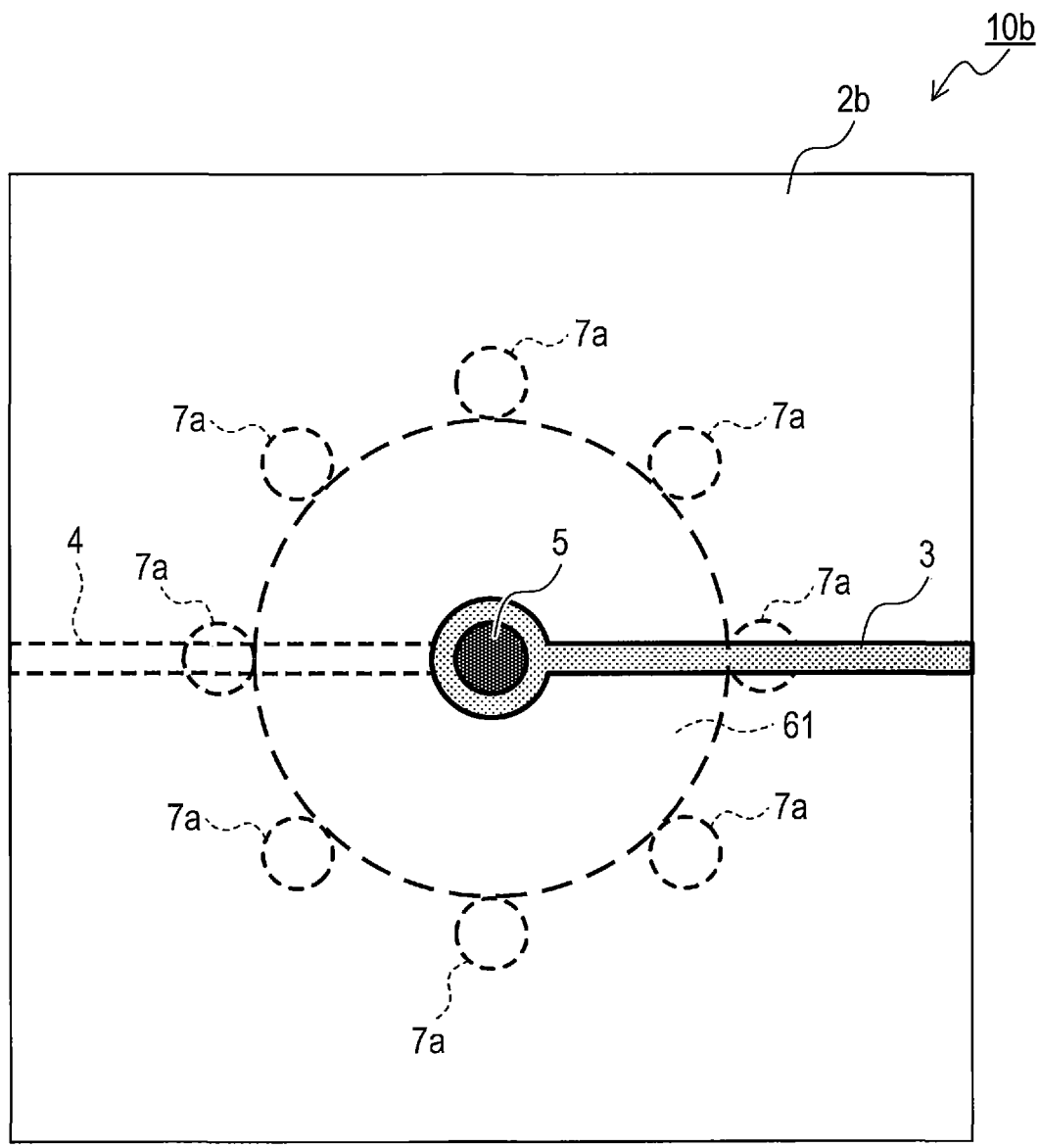
FIG. 9 is a plan view of a high-frequency transmission line according to a third example of a first embodiment.

A high-frequency transmission line 10b according to a third example of the first embodiment will now be described with reference to FIG. 9. The high-frequency transmission line 10b includes a multilayer substrate 2b, signal lines 3 and 4, a signal via 5, and eight interlayer vias 7a. That is, the high-frequency transmission line 10b is different from the high-frequency transmission line 10a in that it includes six interlayer vias 7a in place of the six through vias 7, i.e., all ground vias are interlayer vias 7a.

1-4. Fourth Example

Figure 10:
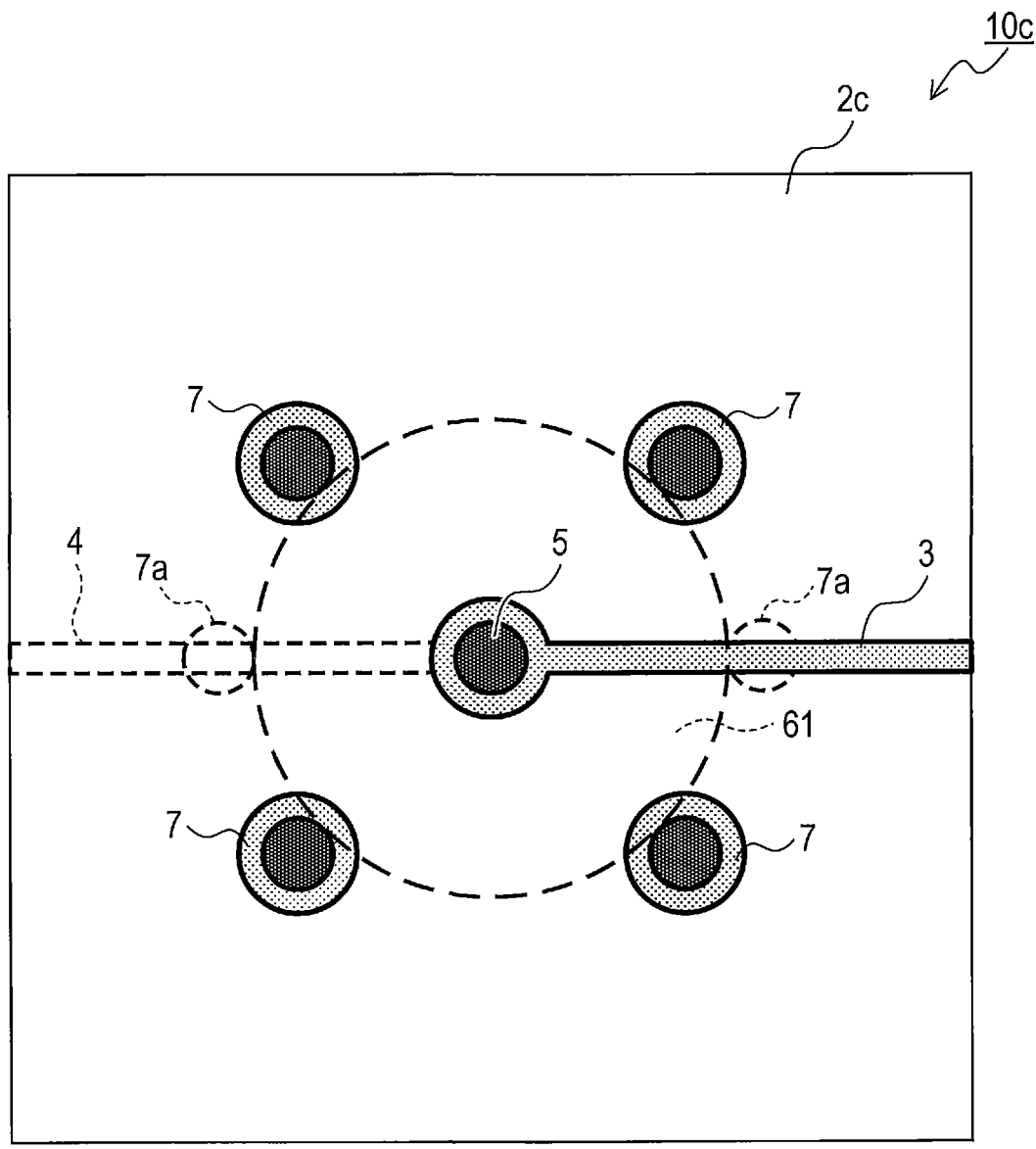
FIG. 10 is a plan view of a high-frequency transmission line according to a fourth example of a first embodiment.

A high-frequency transmission line 10c according to a fourth example of the first embodiment will now be described with reference to FIG. 10. The high-frequency transmission line 10c includes a multilayer substrate 2c, signal lines 3 and 4, a signal via 5, four through vias 7, and two interlayer vias 7a. That is, the high-frequency transmission line 10c has two less through vias 7 than the high-frequency transmission line 10a. Any number of ground vias may be provided so long as the high-frequency signal can be sufficiently confined inside an interlayer transmission line 62 (illustrated in, for example, FIGS. 2 and 8).

1-5. Fifth Example

Figure 11:
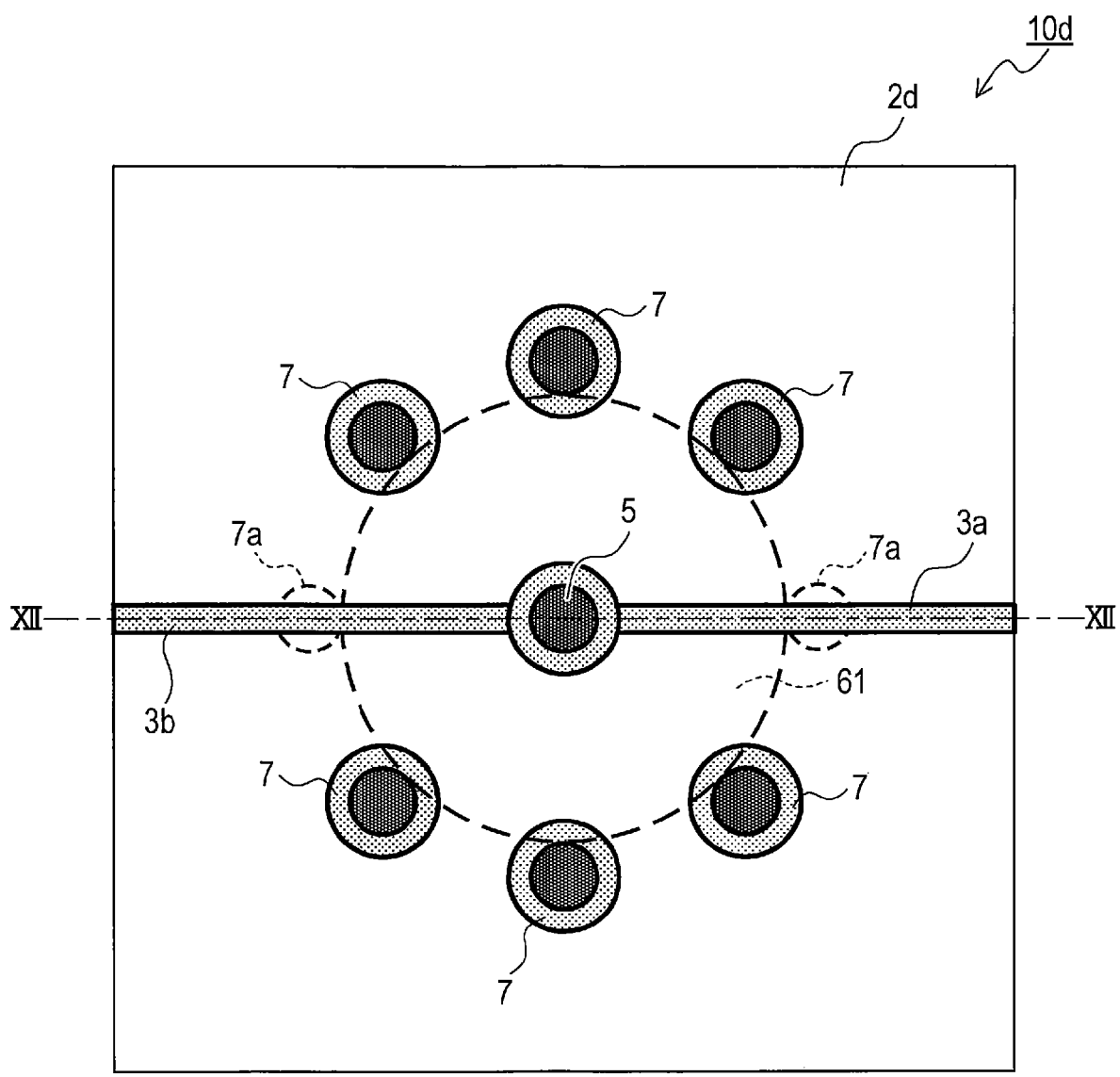
FIG. 11 is a plan view of a high-frequency transmission line according to a fifth example of a first embodiment.
Figure 12:
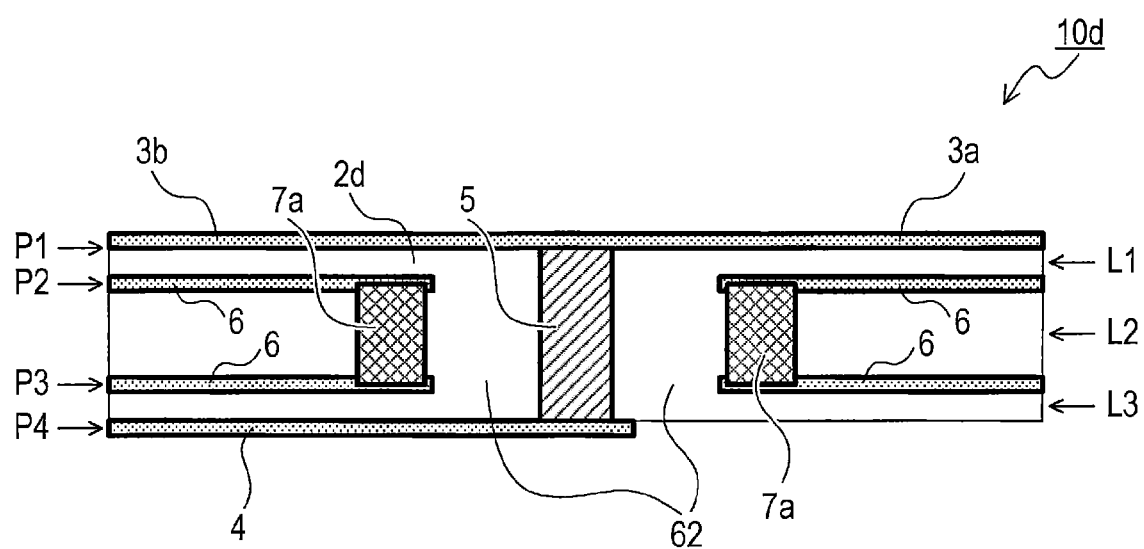
FIG. 12 is a cross section view taken along line XII-XII in FIG. 11.

A high-frequency transmission line 10d according to a fifth example of the first embodiment will now be described with reference to FIGS. 11 and 12. The high-frequency transmission line 10d includes a multilayer substrate 2d, signal lines 3a, 3b, and 4, a signal via 5, six through vias 7, and two interlayer vias 7a. The multilayer substrate 2d has the same configuration as that of the multilayer substrate 2a. That is, the high-frequency transmission line 10d is different from the high-frequency transmission line 10a in that it includes a signal line 3a and a signal line 3b in place of the signal line 3.

The signal lines 3a and 3b are conductive patterns formed on the outer layer P1. The signal line 3b is disposed at a position overlapping the signal line 4 in the layer stacking direction. The signal lines 3a and 3b are coupled to the signal via 5 and are disposed along a straight line through the signal via 5. In this way, a high-frequency signal input from the signal line 4 to the interlayer transmission line 62 (illustrated in, for example, FIG. 12) can be branched and output to the signal lines 3a and 3b.

<1-6. Advantageous Effects>

According to the first embodiment described above, the following advantageous effects are achieved.

(1) The via diameter r1 is determined to enable propagation of a high-frequency signal through an interlayer transmission line 62 causing multi mode propagation (multimode interference propagation). That is, the via diameter r1 is set to a value larger than the via diameter that enables single mode propagation of a high-frequency signal through the interlayer transmission line 62. Therefore, the high-frequency transmission lines 10 and 10a to 10d can be mass-produced. At least one of the substrate thickness Ho, the inter-via distance Rd, and the via diameter r1 of each of the high-frequency transmission lines 10 and 10a to 10d is designed to introduce a high-frequency signal from the interlayer transmission line 62 to the signal line 3 or 4 in the high-intensity region of the electric field. This suppresses the transmission loss during propagation of the high-frequency signal through the interlayer transmission line 62. Therefore, the high-frequency transmission lines 10 and 10a to 10d that are mass-producible and suppress the transmission loss can be realized.

(2) The high-frequency transmission lines 10a to 10d according to the respective second to fourth examples each include interlayer vias 7a disposed at positions above or below the signal lines 3 and 4. This can enable even more effective confinement of a high-frequency signal in the interlayer transmission line 62 of each of the high-frequency transmission lines 10a to 10d and thus can suppress the transmission loss even more.

2. Second Embodiment 2-1. First Example

<2-1-1. Difference from First Embodiment>

The basic configuration of the second embodiment is the same as the example of the first embodiment. Therefore, the second embodiment will be described through the difference from the first embodiment, and descriptions of common configurations will be omitted. Note that the reference signs that are the same as those in the first embodiment denote the same configurations. Therefore, the foregoing description should be referred to.

The high-frequency transmission line according to a second embodiment is different from those according to the examples of the first embodiment in that it includes multiple inner-layer lands for reducing the width of the interlayer transmission line.

In the first embodiment, at least one of the substrate thickness Ho, the inter-via distance Rd, and the via diameter r1 is adjusted to adjust the electric field distribution. Here, the substrate thickness Ho may not be freely adjusted because of restrictions due to the device in which the high-frequency transmission line is to be used. In regard to this, the substrate thickness Ho may be constant, and the inter-via distance Rd may be reduced to adjust the electric field distribution. When the inter-via distance Rd is reduced, the region in which the electric field of the high-frequency signal is distributed decreases between the signal via 5 and the ground vias 7 and 7a, and the number of higher-order modes excited in the interlayer transmission line 62 decreases. Therefore, a high-intensity region of the electric field distribution can be more readily formed in the output portion of the interlayer transmission line 62.

Figure 13:
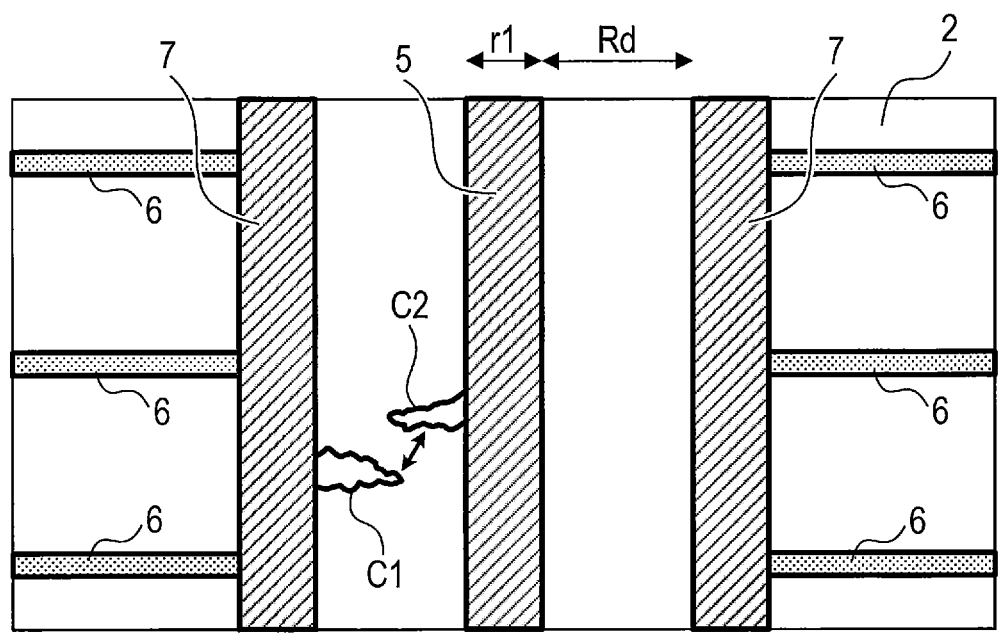
FIG. 13 is a diagram illustrating a state in which a signal via and a ground vias are electrically connected due to cracks formed in a substrate between the signal via and the ground vias.

However, a decrease in the inter-via distance Rd may increase the possibility of the signal via 5 and the ground vias 7 and 7a being electrically coupled, as illustrated in FIG. 13. The ground vias 7 and 7a are formed by opening holes in dielectric layers with a drill and plating the holes. When holes are formed in the dielectric layers with a drill, cracks C1 and C2 may form, and the plating may seep into the cracks C1 and C2. When the inter-via distance Rd is small, the plating that seeps into the cracks C1 and C2 may cause the signal via 5 and the ground vias 7 and 7a to be electrically coupled. Therefore, the inter-via distance Rd should be larger than or equal to a predetermined value in view of reliability. For example, it is desirable that the inter-via distance Rd be 0.45 mm or more.

Therefore, the high-frequency transmission line according to the second embodiment includes multiple inner-layer lands. In the high-frequency transmission line, the multiple inner-layer lands define quasi walls protruding further into the interlayer transmission line 62 than at least one of the sidewalls of the signal via 5 and the sidewalls of the ground vias 7 and 7a, causing a decrease in the width of the interlayer transmission line 62.

Figure 14:
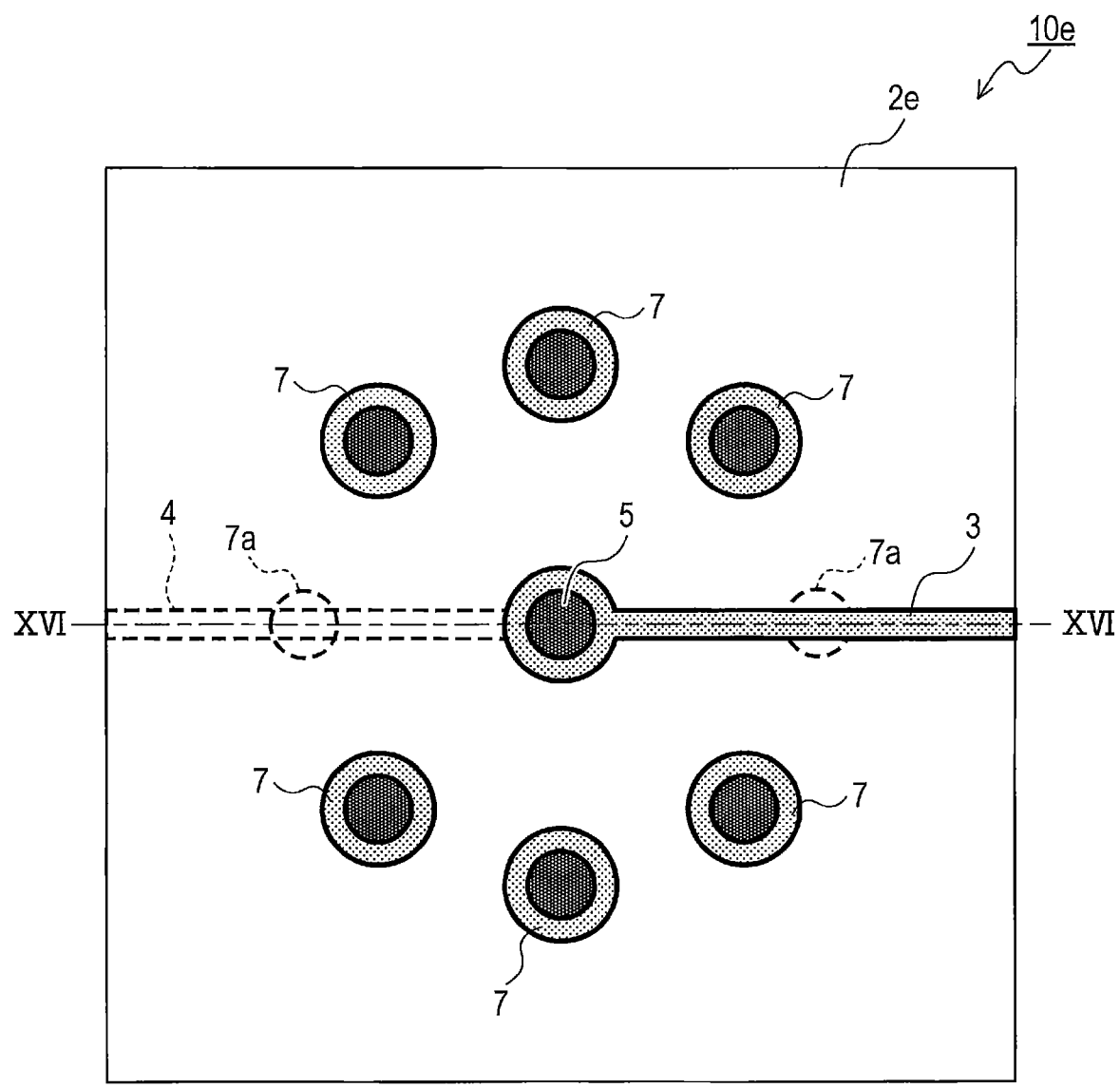
FIG. 14 is a plan view of a surface of a high-frequency transmission line according to a first example of a second embodiment.
Figure 15:
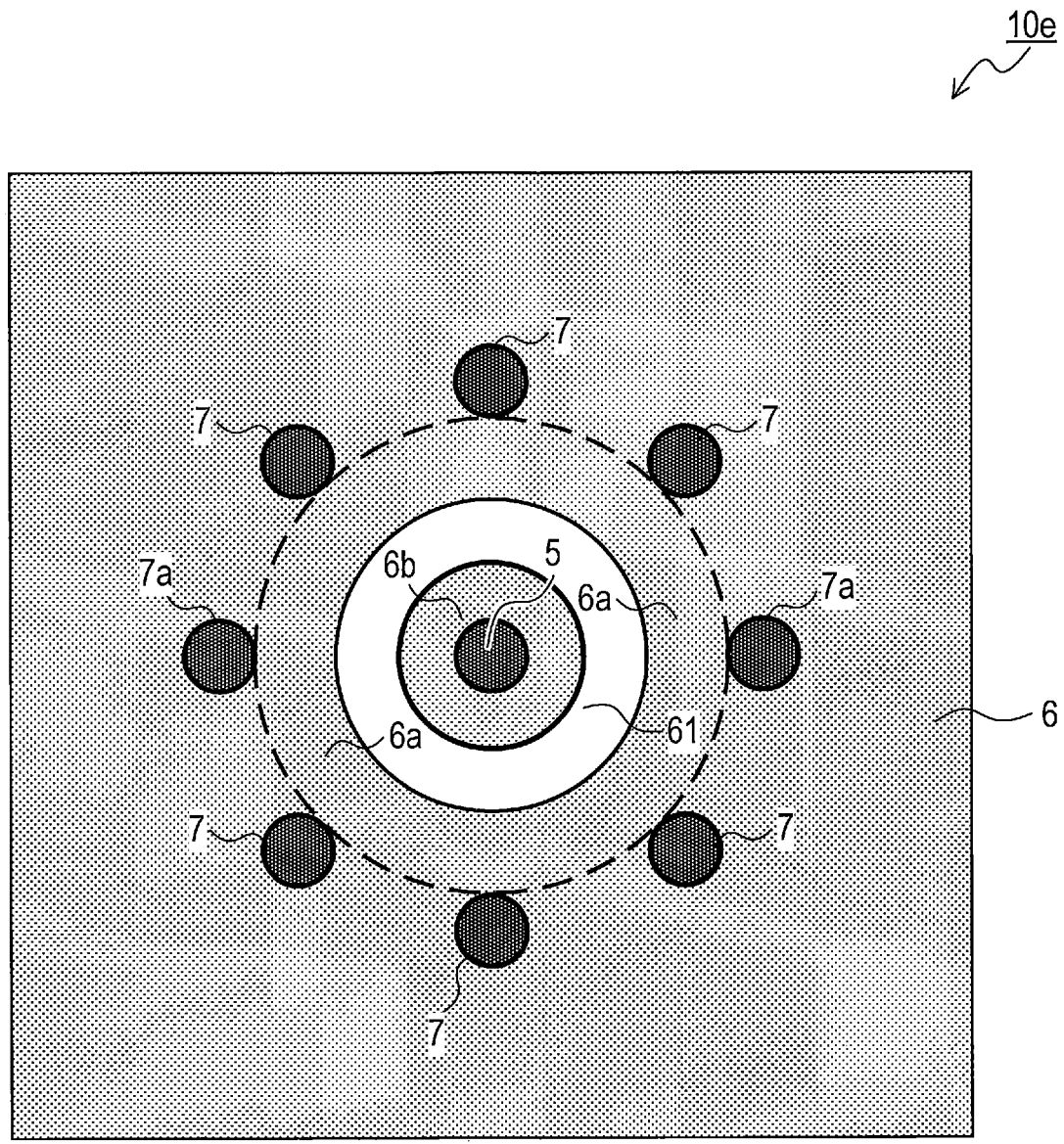
FIG. 15 is a plan view of an inner face of a high-frequency transmission line according to a first example of a second embodiment.
Figure 16:
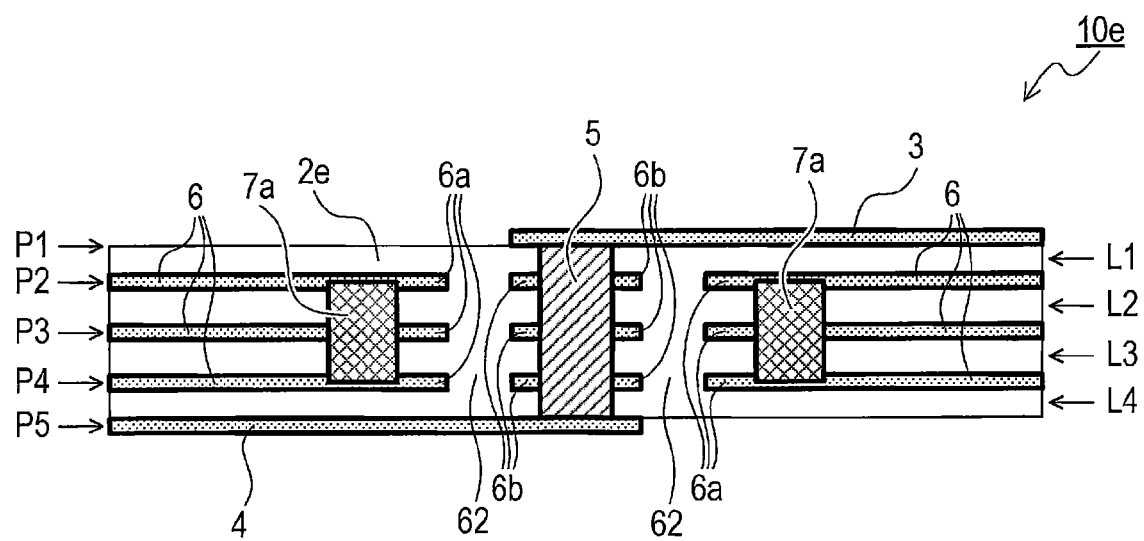
FIG. 16 is a cross section view taken along line XVI-XVI in FIG. 14.

The configuration of a high-frequency transmission line 10e according to a first example of the second embodiment will now be described with reference to FIGS. 14 to 16. The high-frequency transmission line 10e includes a multilayer substrate 2e, signal lines 3 and 4, a signal via 5, six through vias 7, two interlayer vias 7a, three first inner-layer lands 6a, and three second inner-layer lands 6b.

The multilayer substrate 2e includes four dielectric layers L1, L2, L3 and L4 and five pattern layers P1, P2, P3, P4 and P5 sandwiching the dielectric layers L1, L2, L3 and L4. Hereinafter, the pattern layers P1 and P5 disposed on the outer faces of the multilayer substrate 2e, among the pattern layers P1, P2, P3, P4 and P5, are referred to as "outer layers", and the other pattern layers P2, P3 and P4 are referred to as "intermediate layers".

The signal line 3 and 4 are respectively formed on the outer layers P1 and P5. A ground plane 6, a first inner-layer land 6a, and a second inner-layer land 6b are formed on each of the intermediate layer P2, P3 and P4. That is, in each of the intermediate layers P2, P3 and P4, a portion of a conductive pattern serves as the ground plane 6, another portion of the conductive pattern serves as the first inner-layer land 6a, and another portion of the conductive pattern serves as the second inner-layer land 6b.

The first inner-layer lands 6a are conductive patterns coupled to the eight ground vias 7 and 7a and integrated with the ground planes 6. As illustrated in FIG. 15, the first inner-layer lands 6a are annular conductive patterns coupled to the sidewalls of the eight ground vias 7 and 7a facing the signal via 5 and protruding toward the signal via 5. The second inner-layer lands 6b are annular conductive patterns coupled to the signal via 5 and protruding from the sidewall of the signal via 5 toward the eight ground vias 7 and 7a. The first inner-layer lands 6a and the second inner-layer lands 6b are annular conductive patterns defined by two concentric circles around the signal via 5.

The three first inner-layer lands 6a and the three second inner-layer lands 6b are disposed along the layer stacking direction at intervals smaller than or equal to ¼ of the wavelength $\lambda g$ of the high-frequency signal propagating through the interlayer transmission line 62. That is, the thickness of the dielectric layers L2 and L3 is $\lambda g/4$ or less. In this way, a quasi side face is formed by the edges of the three first inner-layer lands 6a at a position closer to the signal via 5 than the sidewalls of the eight ground vias 7 and 7a, as illustrated in FIG. 16. Moreover, a quasi side face is formed by the edges of the three second inner-layer lands 6b at a position closer to the ground vias 7 and 7a than the sidewall of the signal via 5. The interlayer transmission line 62 having a width smaller than the inter-via distance Rd is formed between the two quasi side faces.

<2-1-2. Analytical Result>

Figure 17:
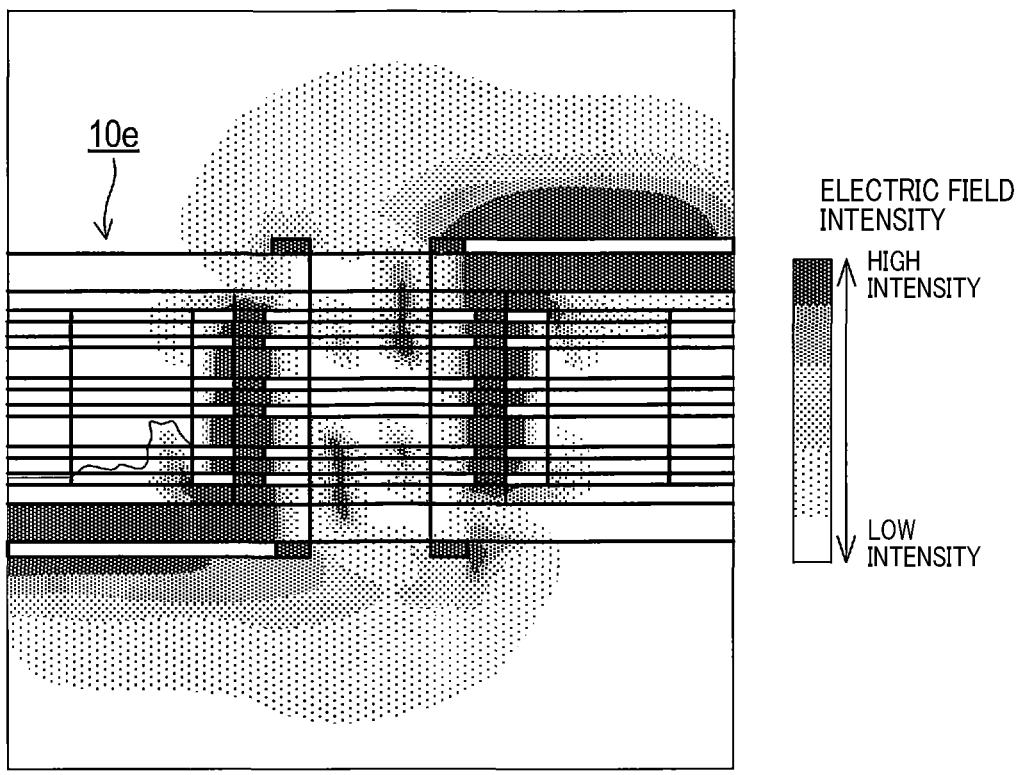
FIG. 17 is a cross section view in a thickness direction showing an electric field distribution in a high-frequency transmission line including inner-layer lands when a signal propagates through the high-frequency transmission line.
Figure 18:
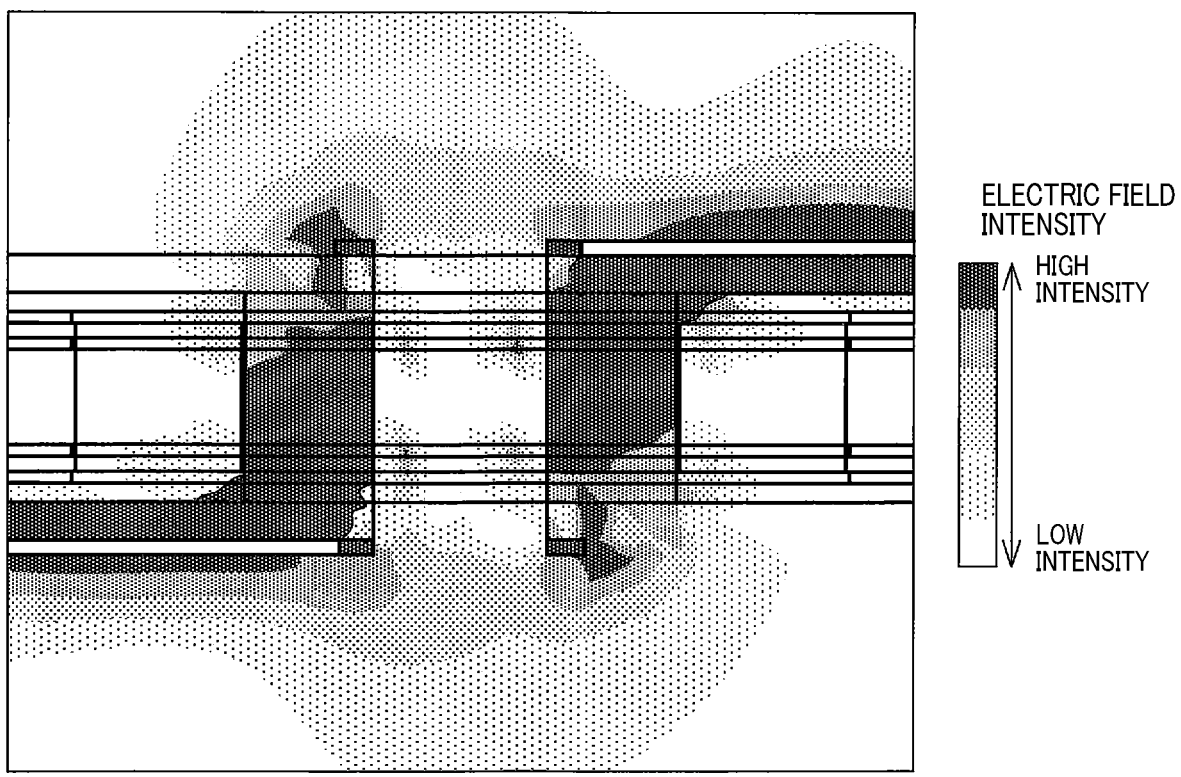
FIG. 18 is a cross section view in a thickness direction showing an electric field distribution in a high-frequency transmission line including no inner-layer lands when a signal propagates through the high-frequency transmission line.
Figure 19:
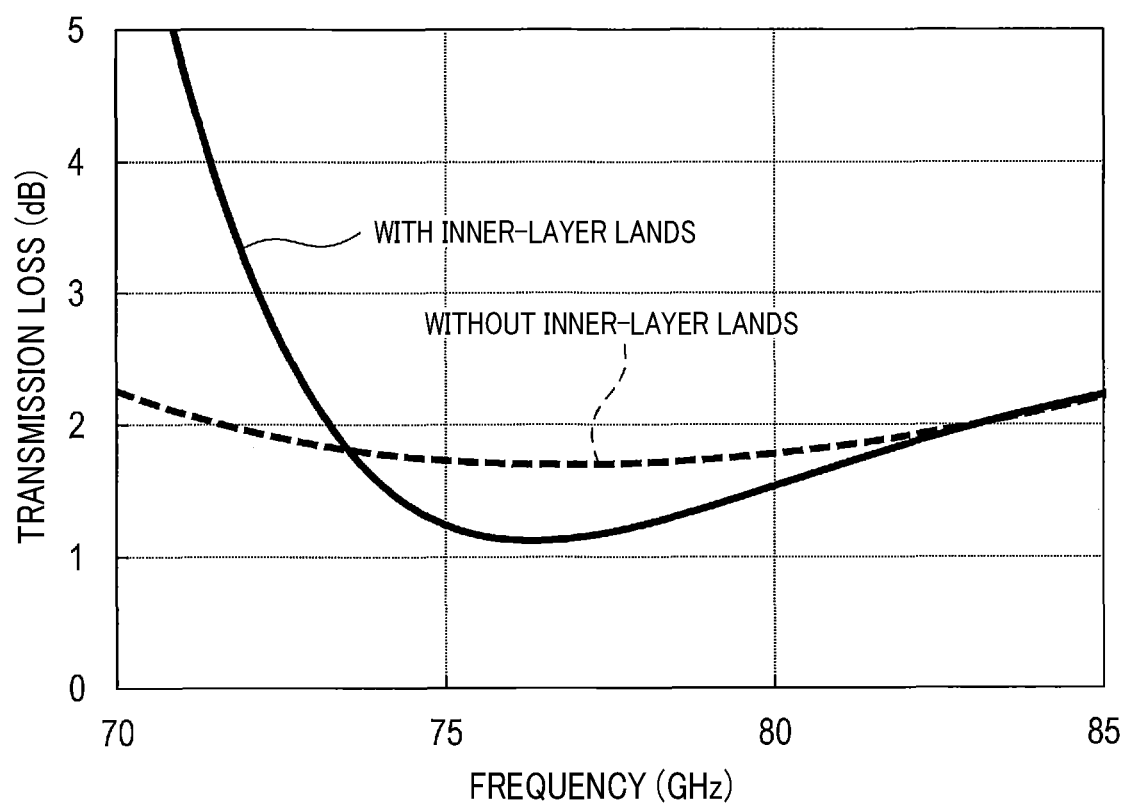
FIG. 19 is diagram illustrating a transmission loss corresponding to a frequency in a high-frequency transmission line including inner-layer lands and a high-frequency transmission line including no inner-layer lands.

FIG. 17 illustrates the analytical result of the electric field distribution in a cross-section in the layer stacking direction of the high-frequency transmission line 10e including the inner-layer lands. As a comparative example, FIG. 18 illustrates the analytical result of the electric field distribution in a cross-section in the layer stacking direction of a high-frequency transmission line including no inner-layer lands, which is the same as the high-frequency transmission line 10e without the first inner-layer lands 6a and the second inner-layer lands 6b. As illustrated in FIG. 17, the electric field distribution is narrow in the interlayer transmission line 62 of the high-frequency transmission line 10e compared to that in the comparative example. FIG. 19 illustrates the transmission loss in dB corresponding to a frequency in GHz in the high-frequency transmission line 10e and the comparative example. As illustrated in FIG. 19, the transmission loss within the frequency range of 74 to 82 GHz in the high-frequency transmission line 10e is smaller than that in the comparative example.

2-2. Second Example

Figure 20:
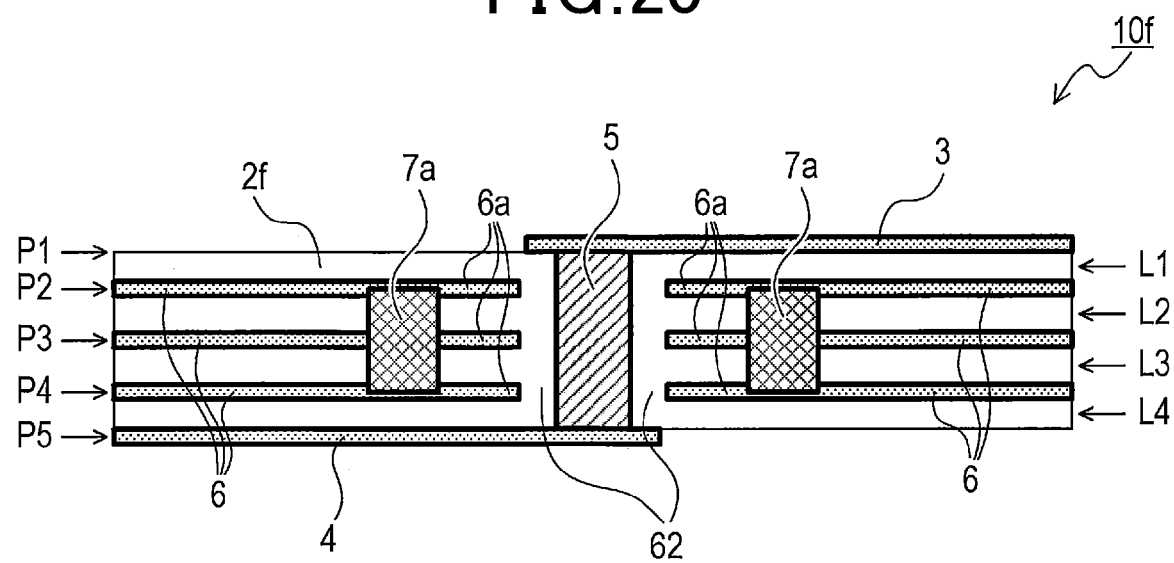
FIG. 20 is a cross section view of a high-frequency transmission line according to a second example of a second embodiment.

A high-frequency transmission line 10f according to a second example of the second embodiment will now be described with reference to FIG. 20. The high-frequency transmission line 10f includes a multilayer substrate 2f, signal lines 3 and 4, a signal via 5, six through vias 7 (not illustrated), two interlayer vias 7a, and first inner-layer lands 6a. That is, the high-frequency transmission line 10f is different from the high-frequency transmission line 10e in that it does not include the second inner-layer lands 6b. Instead, the length of the first inner-layer lands 6a of the high-frequency transmission line 10f protruding toward the signal via 5 is larger than that of the first inner-layer lands 6a of the high-frequency transmission line 10e. In other words, the ring of each of the first inner-layer lands 6a has an increased width. In the high-frequency transmission line 10f having such a configuration, the width of the interlayer transmission line 62 can be reduced to a level similar to that of the high-frequency transmission line 10e.

2-3. Third Example

Figure 21:
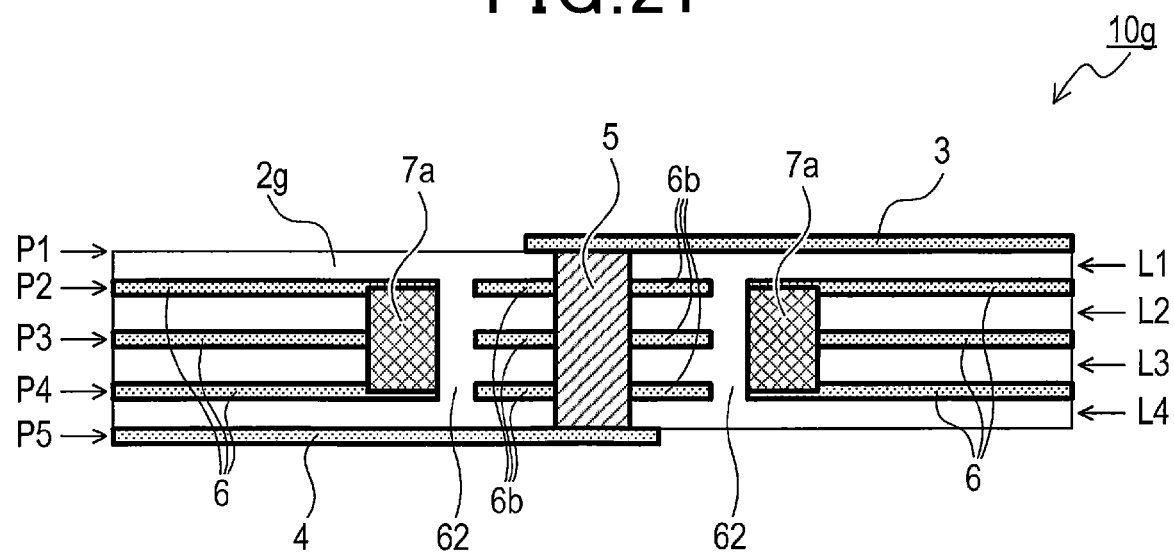
FIG. 21 is a cross-section view of a high-frequency transmission line according to a third example of a second embodiment.

A high-frequency transmission line 10g according to a third example of the second embodiment will now be described with reference to FIG. 21. The high-frequency transmission line 10g includes a multilayer substrate 2g, signal lines 3 and 4, a signal via 5, six through vias 7 (not illustrated), two interlayer vias 7a, and second inner-layer lands 6b. That is, the high-frequency transmission line 10g is different from the high-frequency transmission line 10e in that it does not include the first inner-layer lands 6a. Instead, the lengths of the second inner-layer lands 6b of the high-frequency transmission line 10g protruding toward the eight ground vias 7 and 7a are larger than those of the second inner-layer lands 6b of the high-frequency transmission line 10e. In other words, the ring of each of the second inner-layer lands 6b has an increased width. In the high-frequency transmission line 10g having such a configuration, the width of the interlayer transmission line 62 can be reduced to a level similar to that of the high-frequency transmission line 10e.

<2-4. Advantageous Effects>

According to the second embodiment described above, the following advantageous effects are achieved in addition to the advantageous effect (1) or (2) of the first embodiment described above.

(3) Since the high-frequency transmission lines 10e to 10g each include at least one of the first inner-layer lands 6a and the second inner-layer lands 6b, the number of higher-order modes of the high-frequency signal excited by the interlayer transmission lines 62 of each of the high-frequency transmission lines 10e to 10g is reduced, and the influence of the high-order modes is suppressed. As a result, high-intensity regions of the electric field distribution are formed in the output portion of the interlayer transmission line 62, and thereby the transmission losses of the high-frequency transmission lines 10e to 10g are suppressed. That is, the high-frequency transmission lines 10e to 10g achieve advantageous effects equivalent to those in a case where the inter-via distance Rd is small.

(4) In each of the high-frequency transmission lines 10e to 10g, the intervals of the first inner-layer lands 6a and the second inner-layer lands 6b are $\mu g/4$ or less in the layer stacking direction. As a result, the quasi side face protruding closer to the ground vias 7 and 7a than the sidewall of the signal via 5 and/or the quasi side face protruding closer to the signal via 5 than the ground vias 7 and 7a. Therefore, the high-frequency transmission lines 10e to 10g achieve advantageous effects equivalent to those in a case where the inter-via distance Rd is small.

(5) The first inner-layer lands 6a and the second inner-layer lands 6b can be formed in the same layer as the ground plane 6.

3. Third Embodiment 3-1. First Example

<3-1-1. Difference from First Embodiment>

The basic configuration of the third embodiment is the same as the second example of the first embodiment. Therefore, the second embodiment will be mainly described through the difference from the second example of the first embodiment, and description of common configurations will be omitted. Note that the reference signs that are the same as those in the first embodiment denote the same configurations. Therefore, the foregoing description should be referred to.

A high-frequency transmission line according to the third embodiment is different from that of the second example of the first embodiment in that the interlayer vias have a so-called "stub structure".

Figure 22:
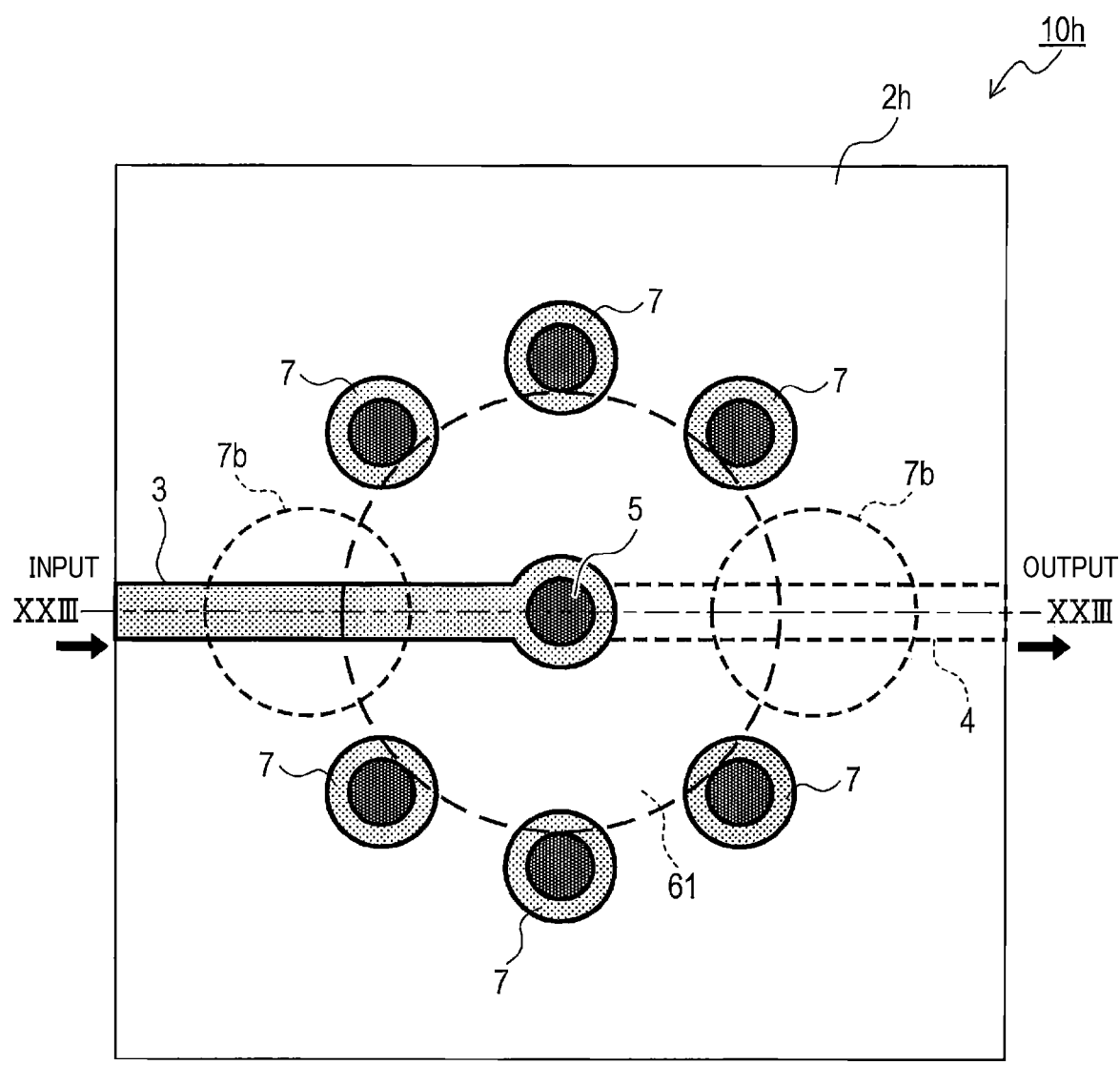
FIG. 22 is a plan view of a high-frequency transmission line according to a first example of a third embodiment.
Figure 23:
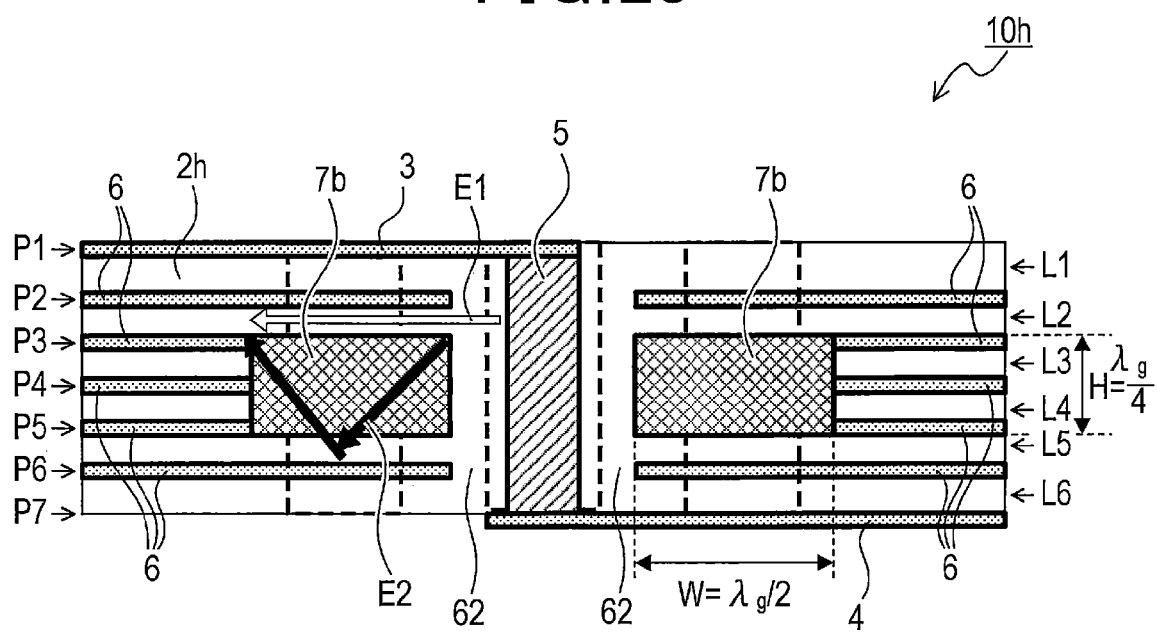
FIG. 23 is a cross section view taken along line XXIII-XXIII in FIG. 22.

The configuration of a high-frequency transmission line 10h according to a first example of the third embodiment will now be described with reference to FIGS. 22 and 23. The high-frequency transmission line 10h includes a multilayer substrate 2h, signal lines 3 and 4, a signal via 5, six through vias 7, and two interlayer vias 7b. The high-frequency transmission line 10h is subjected to electric field distribution adjustment, as in the first embodiment. The signal lines 3 and 4 are coupled to the signal via 5. In this way, a high-frequency signal input from the signal line 3 to the interlayer transmission line 62 (illustrated in, for example, FIG. 23) can be branched and output to the signal line 4.

The multilayer substrate 2h includes six dielectric layers L1, L2, L3, L4, L5 and L6 and seven pattern layers P1, P2, P3, P4, P5, P6 and P7 sandwiching the dielectric layers L1, L2, L3, L4, L5 and L6. Hereinafter, the pattern layers P1 and P7 disposed on the outer faces of the multilayer substrate 2h, among the pattern layers P1, P2, P3, P4, P5, P6 and P7, are referred to as "outer layers", and the other pattern layers P2, P3, P4, P5 and P6 are referred to as "intermediate layers".

The signal line 3 and 4 are respectively formed on the outer layers P1 and P7. Ground planes 6 are formed in the intermediate layers P2, P3, P4, P5 and P6. The two interlayer vias 7b penetrate the dielectric layers L3 and L4 in the middle, among the six dielectric layers L1, L2, L3, L4, L5 and L6, and electrically couple the two ground planes 6 formed in the intermediate layers P3 and P5 to each other.

The dielectric layer L2 is disposed above the interlayer vias 7b, and one of the ground planes 6 is disposed above the dielectric layer L2. The dielectric layer L5 is disposed below the interlayer vias 7b, and another one of the ground planes 6 is disposed below the dielectric layer L5. The dielectric layers L2 and L5 serve as adhesives for mounting the ground planes 6. That is, dielectric layers are always disposed above and below the interlayer vias 7b. The through-holes of the interlayer vias 7b are filled with the same dielectric body comprising the dielectric layers L1, L2, L3, L4, L5 and L6.

Figure 24:
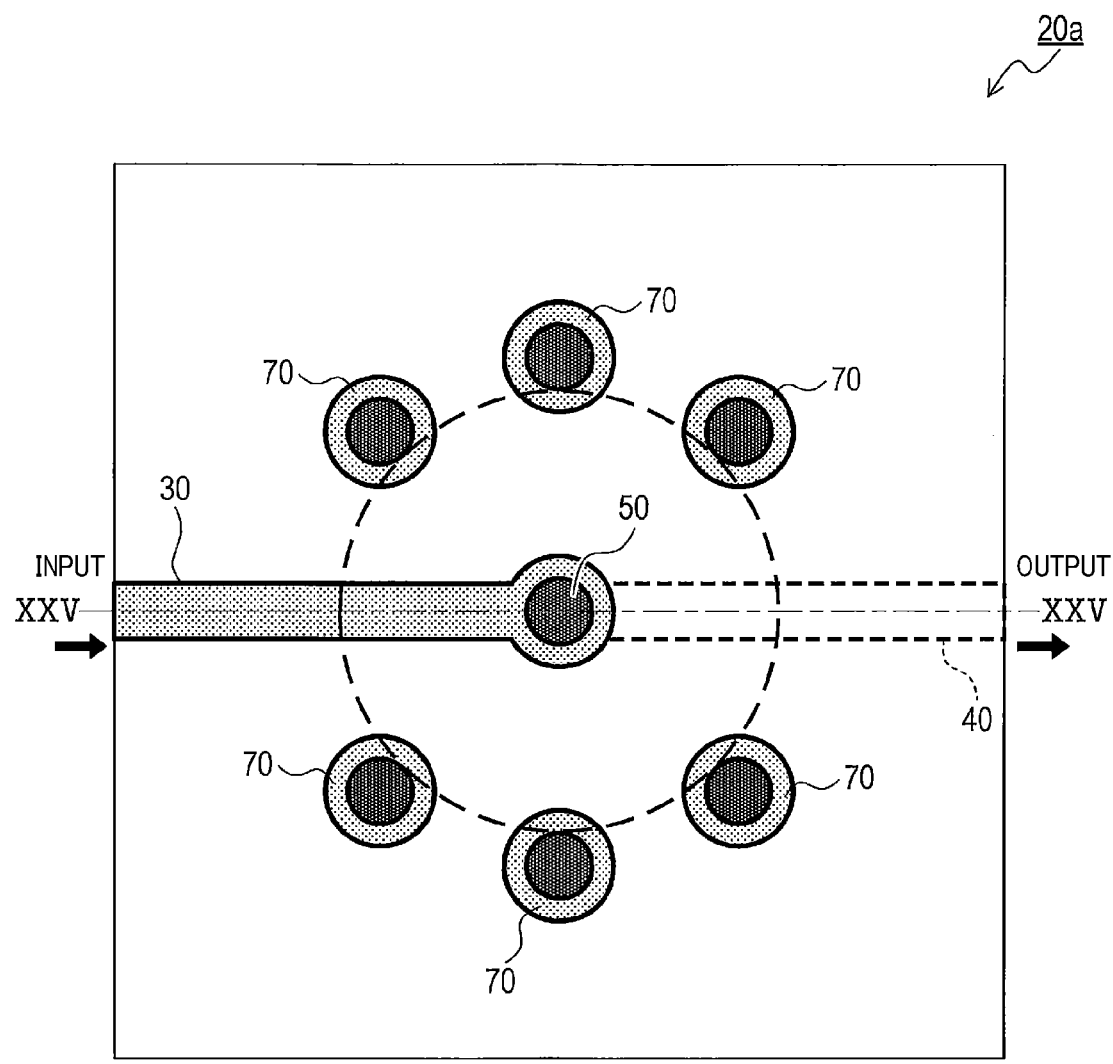
FIG. 24 is a plan view of an example of a conventional high-frequency transmission line.
Figure 25:
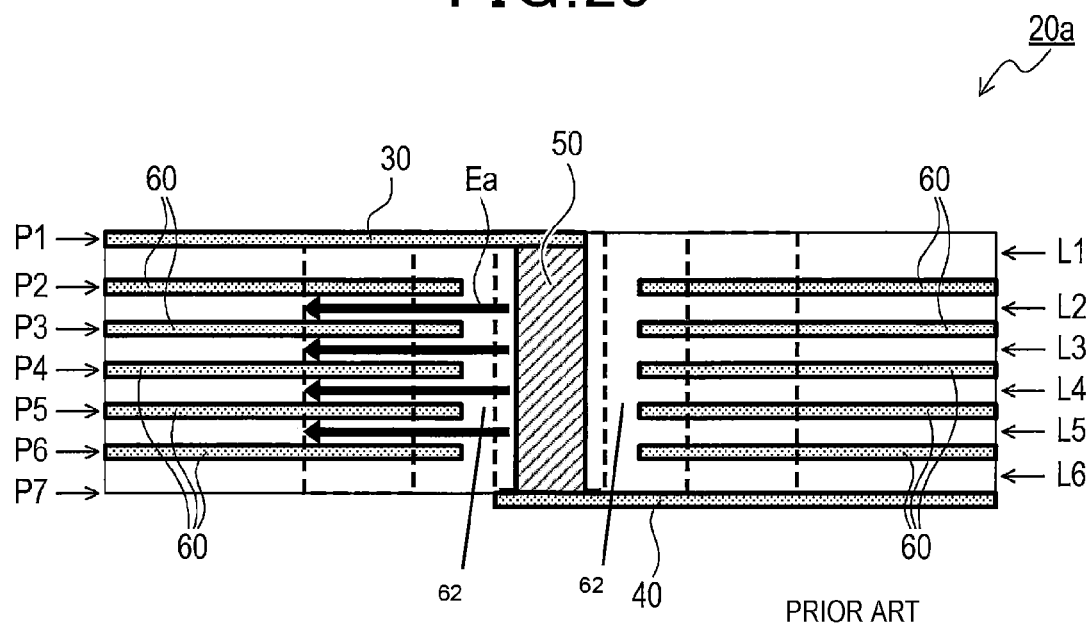
FIG. 25 is a cross section view of an example of a conventional high-frequency transmission line taken along line XXV-XXV in FIG. 24.

A high-frequency transmission line 20a having a signal line 30, a signal line 40, a signal via 50, ground plane 60 and vias 70 but no interlayer vias is illustrated in FIGS. 24 and 25. The signal lines 30 and 40 are coupled to the signal via 50. In this way, a high-frequency signal input from the signal line 30 and output to the signal line 40. The high-frequency transmission line 20a does not include ground vias at positions overlapping the signal lines 30 and 40. Therefore, in the high-frequency transmission line 20a, an electric field Ea of the high-frequency signal leaks from an interlayer transmission line 62 to the dielectric layers L2, L3, L4 and L5 below the signal line 30 and above the signal line 40.

Figure 26:
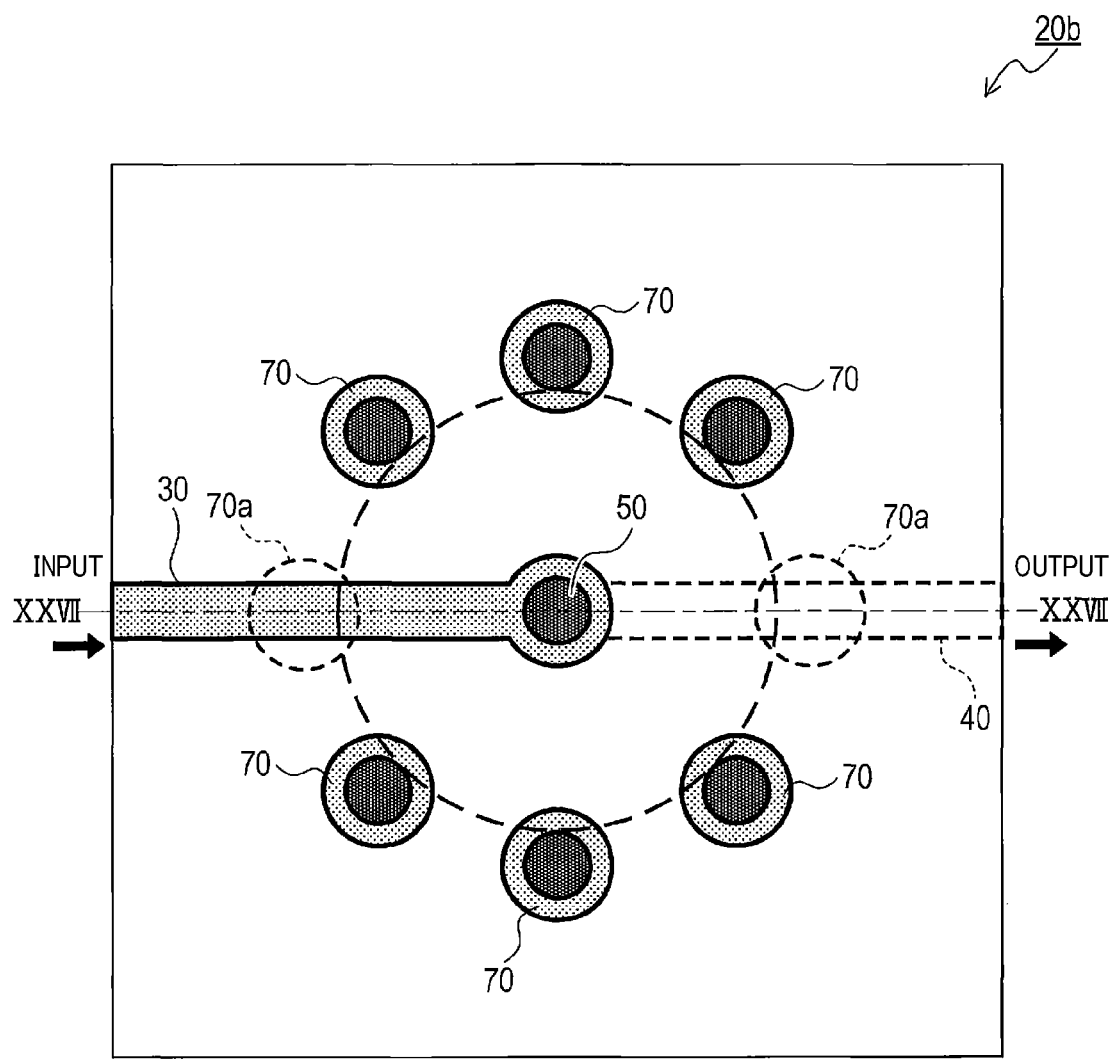
FIG. 26 is a plan view of another example of a conventional high-frequency transmission line.
Figure 27:
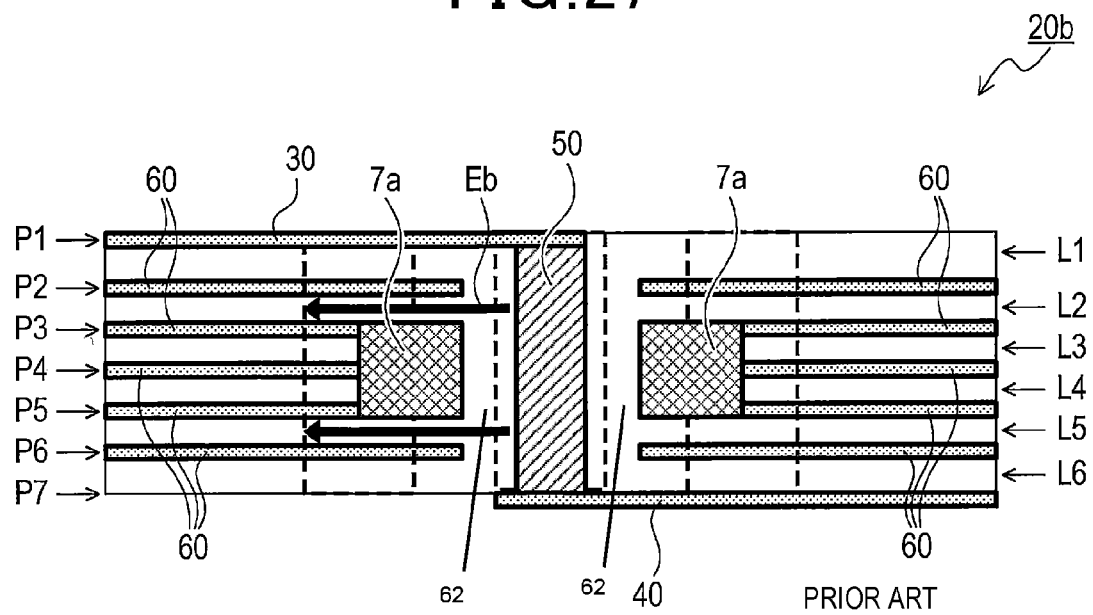
FIG. 27 is a cross section view of another example of a conventional high-frequency transmission line taken along line XXVII-XXVII in FIG. 26.

A high-frequency transmission line 20b having a signal line 30, a signal line 40, a signal via 50, ground plane 60 and interlayer vias 70a is illustrated in FIGS. 26 and 27. The signal lines 30 and 40 are coupled to the signal via 50. In this way, a high-frequency signal input from the signal line 30 and output to the signal line 40. In the high-frequency transmission line 20b, an electric field Eb leaks from an interlayer transmission line 62 to dielectric layers L2, L3, L4 and L5 disposed above and below the interlayer vias 70a. When the electric field leaks from the interlayer transmission line 62, the transmission loss increases by a corresponding amount. Therefore, it is desirable to suppress the electric field leakage.

Therefore, in this embodiment, the interlayer vias 7b have a so-called "stub structure" to suppress the electric field leakage and reduce the transmission loss. That is, with reference to FIGS. 22 and 23, the interlayer vias 7b have dimensions that cause a first electric field E1 and a second electric field E2 leaking from the interlayer transmission line 62 in a direction toward the interlayer vias 7b to mutually cancel. The first electric field E1 is a leakage electric field that travels through the dielectric layers L2 and L5 respectively disposed between the interlayer vias 7b and the ground plane 6 above the interlayer vias 7b and between the interlayer vias 7b and the ground plane 6 below the interlayer vias 7b. The second electric field E2 is a leakage electric field entering one of the interlayer vias 7b. The second electric field E2 enters the interlayer via 7b and is reflected at the ground plane 6 above or below the interlayer via 7b.

Specifically, the width W of the interlayer via 7b in a direction orthogonal to the layer stacking direction in the cross-section passing through the central axes of the interlayer via 7b and the signal via 5 is $\lambda g/2$ so that a standing wave is generated in the interlayer via 7b. Moreover, the height H of the interlayer via 7b in the cross-section is $\lambda g/4$ so that the phase of the second electric field E2 shift by 180 degrees relative to the phase of the first electric field E1. That is, the interlayer via 7b is shaped as a cylinder having a diameter of $\lambda g/2$ and a height of $\lambda g/4$.

<3-1-2. Analytical Result>

Figure 28:
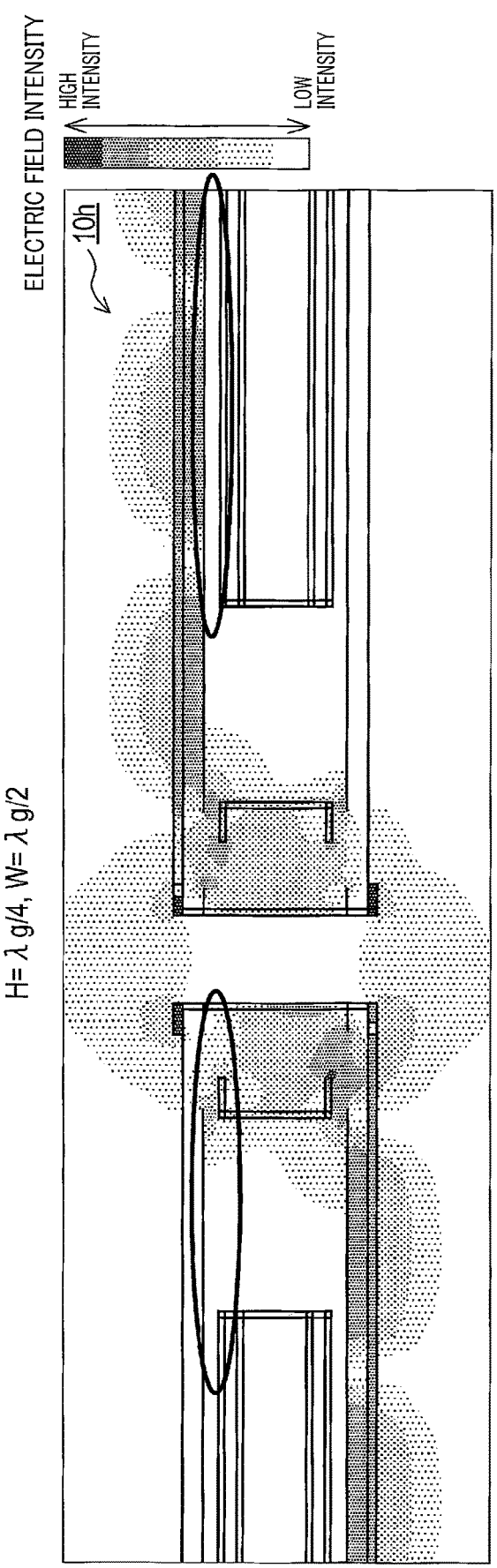
FIG. 28 is a cross section view in a thickness direction showing an electric field distribution in a high-frequency transmission line according to a third embodiment.
Figure 29:
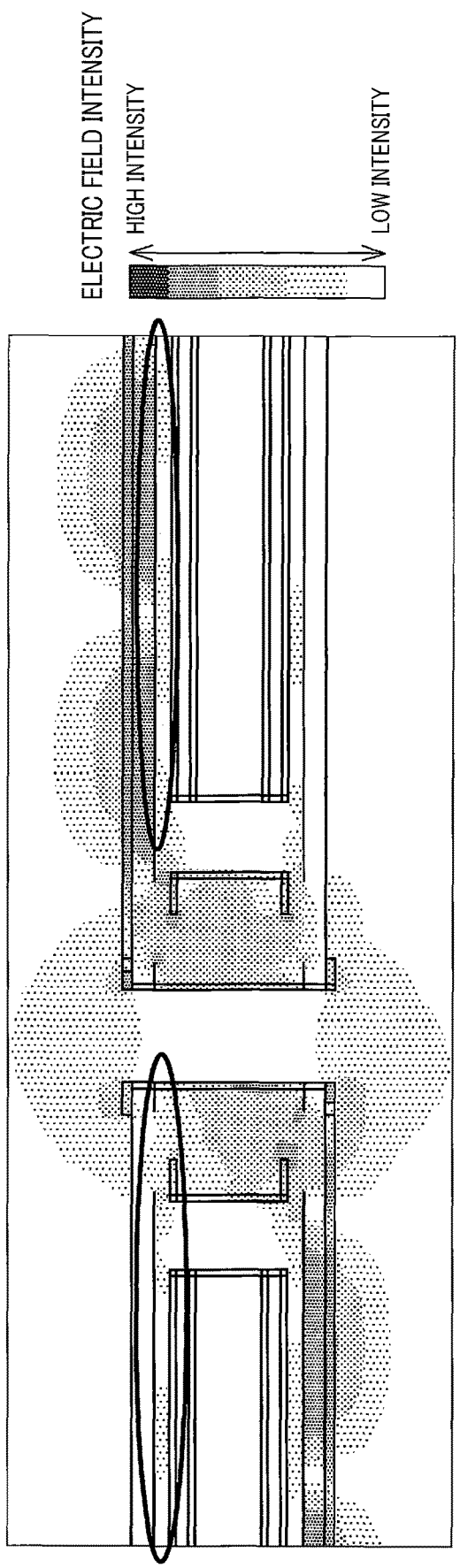
FIG. 29 is a cross section view in a thickness direction showing an electric field distribution in a high-frequency transmission line according to a comparative example.
Figure 30:
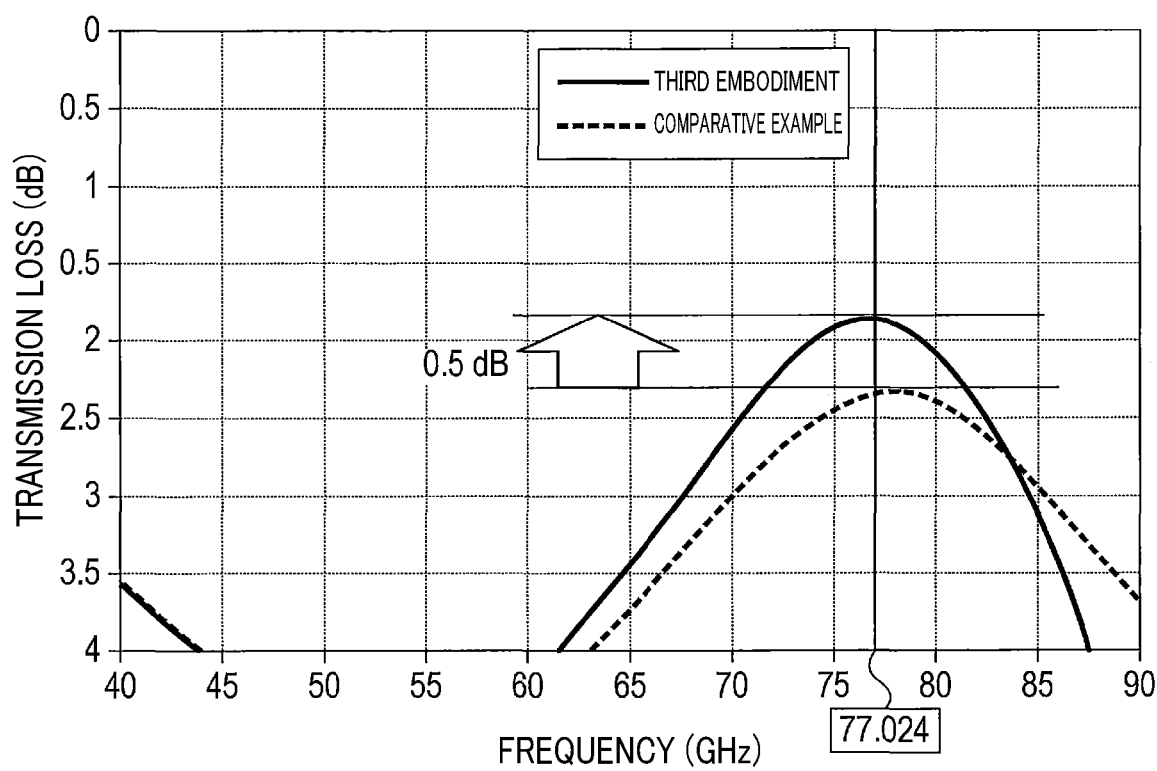
FIG. 30 is a diagram illustrating a transmission loss corresponding to a frequency of a high-frequency transmission line according to a comparative example and a third embodiment.

FIG. 28 illustrates the analytical result of the electric field distribution of the high-frequency transmission line 10h in a cross section in the layer stacking direction. As a comparative example, FIG. 29 illustrates, in a cross section in the layer stacking direction, the analytical result of the electric field distribution of a high-frequency transmission line including interlayer vias having a height H of $\lambda g/4$ and a width W of $\lambda g/6$. A comparative of the portions surrounded by the ovals in FIGS. 28 and 29 indicates that, in the comparative example, the electric field leaks to the dielectric layers between the interlayer vias and the ground plane 6 disposed above the interlayer vias and the interlayer vias and the ground plane 6 disposed below the interlayer vias, wherein, in the high-frequency transmission line 10h, the electric field leakage is suppressed. FIG. 30 illustrates the transmission loss corresponding to a frequency of the high-frequency transmission line 10h and the comparative example. As illustrated in FIG. 30, the transmission loss of the high-frequency transmission line 10h within the frequency range of 63 to 83 GHz is smaller than that of the comparative example. In particular, the transmission loss of the high-frequency transmission line 10h at 77 GHz is improved by 0.5 dB in comparative to the comparative example.

3-2. Second Example

Figure 31:
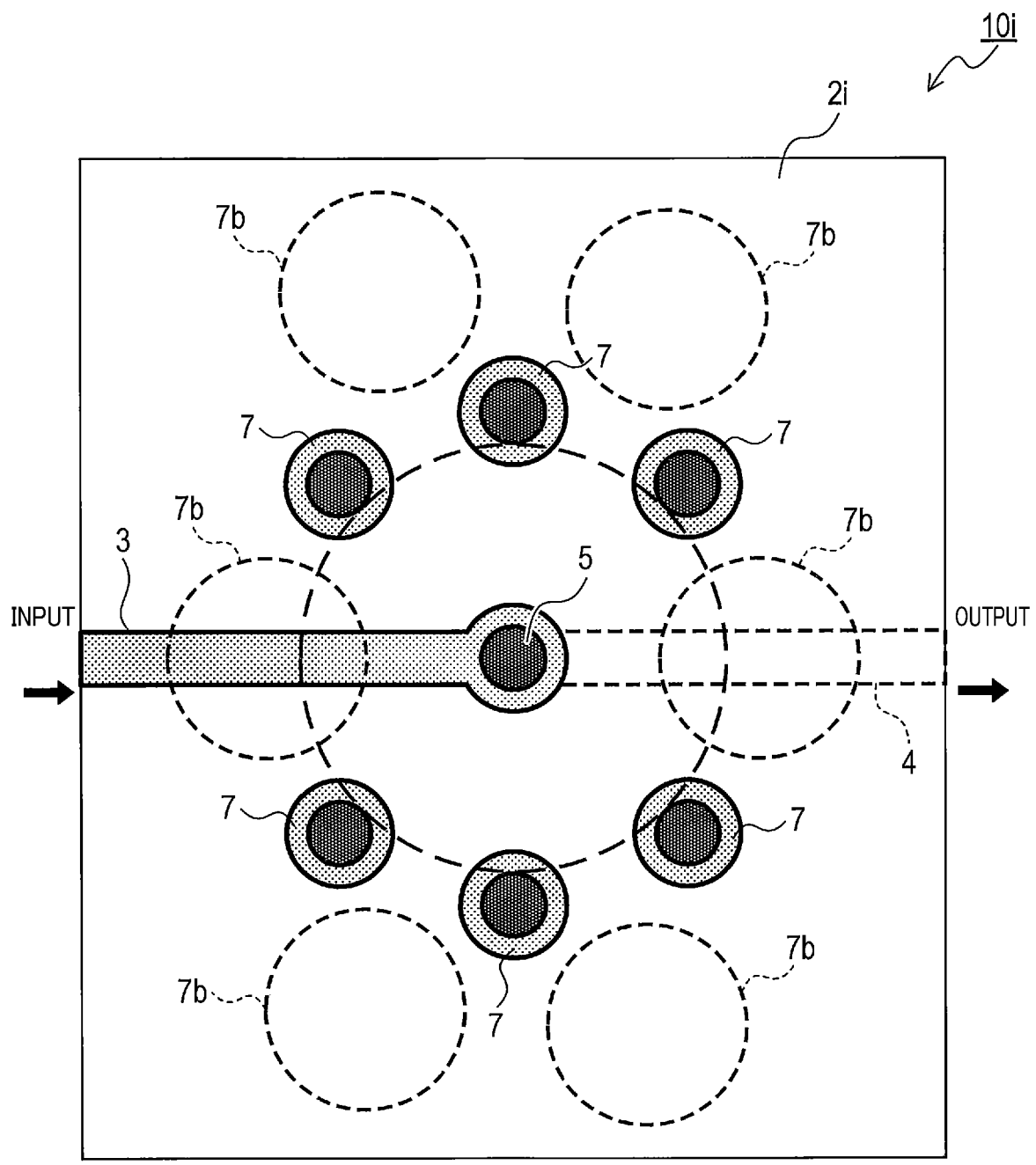
FIG. 31 is a plan view of a high-frequency transmission line according to a second example of a third embodiment.

A high-frequency transmission line 10i according to a second example of the third embodiment will now be described with reference to FIG. 31. The high-frequency transmission line 10i includes a multilayer substrate 2i, signal lines 3 and 4, a signal via 5, six through vias 7, and six interlayer vias 7b. That is, the high-frequency transmission line 10i includes four more interlayer vias 7b than the high-frequency transmission line 10h. The additional four interlayer vias 7b are disposed farther away from the signal via 5 than the six through vias 7 and further radially outward than the six through vias 7. The high-frequency transmission line 10i having such a configuration can suppress electric field leakage more than the high-frequency transmission line 10h and thereby can reduce the transmission loss.

Further, the signal lines 3 and 4 are coupled to the signal via 5. In this way, a high-frequency signal input from the signal line 30 and output to the signal line 40.

<3-3. Advantageous Effects>

According to the third embodiment described above, the following advantageous effects are achieved in addition to the advantageous effect (1) or (2) of the first embodiment described above.

(6) Since the interlayer vias 7b have dimensions that cause the first electric field E1 and the second electric field E2 to mutually cancel, the leak of the electric fields from the interlayer transmission line 62 to the dielectric layers can be suppressed. This can suppress the transmission loss of the high-frequency signal.

(7) Since the width W of the interlayer vias 7b is $\lambda g/2$, the second electric field E2 entering the interlayer vias 7b becomes a standing wave, and since the height H of the interlayer vias 7b is $\mu g/4$, the phase of the second electric field E2, which is a standing wave, shifts by 180 degrees relative to the first electric field E1 traveling the dielectric layers. This causes the first electric field E1 and the second electric field E2 to mutually cancel, and the electric field leakage can be suppressed.

4. Fourth Embodiment

<4-1. Difference from Second Embodiment>

The basic configuration of the fourth embodiment is the same as that of the first example of the second embodiment. As shown in FIG. 32, a high-frequency transmission line 10j according to the fourth embodiment includes a multilayer substrate 2j having the same configuration as that of the multilayer substrate 2i. The high-frequency transmission line 10j includes first inner-layer lands 6a and second inner-layer lands 6b. The high-frequency transmission line 10j has a configuration in that the interlayer vias 7a of the high-frequency transmission line 10e are replaced by the interlayer vias 7b of the high-frequency transmission line 10h according to the first example of the third embodiment. That is, the high-frequency transmission line 10j is subjected to electric field adjustment and includes inner-layer lands and inner layer vias having a stub structure.

FIG. 32 illustrates the analytical result of the electric field distribution of the high-frequency transmission line 10j in a cross section in the layer stacking direction. A comparative of the electric field of the high-frequency transmission line 10j illustrated in FIG. 32 and the electric field of the high-frequency transmission line 10e illustrated in FIG. 18 indicates that the electric field leakage to the dielectric layers between the interlayer vias and the ground planes above and below the interlayer vias in the high-frequency transmission line 10j is suppressed more than in the high-frequency transmission line 10e. That is, in the high-frequency transmission line 10j, the expansion of the electric field distribution in an interlayer transmission line is suppressed, and leakage electric field to the dielectric layers between the interlayer vias and the ground planes above and below the interlayer vias is suppressed.

<4-2. Advantageous Effects>

According to the fourth embodiment described above, the previously described advantageous effects (1), (2), (3), (4), (5), (6) and (7) of the first, second and third embodiments that were described above are achieved.

OTHER EMBODIMENTS

While the embodiments of the disclosure have been described above, the embodiments should not be construed to limit the disclosure, and various modifications can be made to the embodiments.

(a) In the above-described embodiments, the number of layers stacked in the multilayer substrates 2 and 2a to 2j is not limited. The number of layers stacked in the multilayer substrates 2 and 2a to 2j may be appropriately determined. The number of ground vias 7 and 7a may also be appropriately determined.

(b) The structure of the through vias 7 is not limited to one including a through-hole. The through vias 7 may be metal walls disposed to surround the signal via 5 and coupled to the ground planes. For example, the through vias 7 may be arcuate metal walls disposed along the circumference of the circle C. The through vias 7 may be metal grooves each having a rectangular cross-section orthogonal to the layer stacking direction and disposed to surround the signal via 5. For example, in the high-frequency transmission line 10, one of the three of the through vias 7 may be a metal groove, or two metal grooves may be disposed to sandwich the signal lines 3 and 4.

(c) In the third and fourth embodiments, the height H and the width W of each interlayer vias 7b may not be exactly $\mu g/2$ and $\mu g/4$, respectively. The interlayer vias 7b do not have to completely cancel the first electric field E1 and the second electric field E2 but may cancel them to an extent that leads a reduction in the transmission loss. The height H of the interlayer vias 7b may satisfy $0<Ho<\lambda g$, and preferably $(\lambda g/4)\ 0.8<Ho<(\lambda g/4)\times 1.2$. The width W of the interlayer vias 7b may satisfy $0<Wo<\lambda g$, and preferably $(\lambda g/2)\times 0.8<Wo<(\lambda g/2)\times 1.2$.

(d) The multiple functions of a single component in the above-described embodiments may alternatively be achieved by multiple components, or a single function of a single component may alternatively be achieved by multiple components. Multiple functions of multiple components may alternatively be achieved by a single component, or a single function achieved by multiple components may alternatively be achieved by a single component. A portion of the configuration the embodiments described above may be omitted. Alternatively, at least a portion of the configuration of the embodiments described above may be added to or replace a configuration according to another embodiment described above.

(e) In addition to the high-frequency transmission line described above, the disclosure can also be realized in various modes such as a system including the high-frequency transmission line as a component and a method of producing the high-frequency transmission line.

What is claimed is:

1. A high-frequency transmission line, comprising:
a multilayer substrate including a plurality of dielectric layers stacked on each other;
signal lines formed on two outer faces of the multilayer substrate;
a signal via coupling the signal lines formed on the two outer faces;

at least one ground plane disposed between the plurality of dielectric layers, included in the multilayer substrate, and surrounding a removed region disposed around the signal via; and a plurality of ground vias penetrating at least one of the plurality of dielectric layers in a layer stacking direction, surrounding the signal via, and electrically coupled to the at least one ground plane, wherein, an interlayer transmission region is defined by the signal via and the plurality of ground vias, within which a high-frequency signal is transmitted in the layer stacking direction through the interlayer transmission region, a via diameter of the signal via is set to a dimension that causes multi mode propagation of the high-frequency signal in the interlayer transmission region, and, while causing the multi mode propagation, the high-frequency signal forms a high-intensity region having a high intensity electric field in a transmission direction and a low-intensity region having a low intensity electric field in the transmission direction, when the high-frequency signal is transmitted through the interlayer transmission region causing the multi mode propagation, the high-intensity region and the low-intensity region are alternately formed in the interlayer transmission region along the transmission direction, and at least one of an inter-via distance between the signal via and each of the plurality of ground vias, the via diameter, and a substrate thickness of the multilayer substrate is set to couple the high-frequency signal from the interlayer transmission region, in which the high-intensity region of the multi mode propagation is formed, to the signal lines, wherein, in a case where the inter-via distance is a predetermined value, the via diameter is decreased to alternately form the high-intensity region and the low-intensity region in the interlayer transmission region, and the via diameter is set to 0.3 mm or more, or in a case where the substrate thickness is a predetermined value, the inter-via distance is decreased to alternately form the high-intensity region and the low-intensity region in the interlayer transmission region, and the inter-via distance is set to 0.45 mm or more.

2. The high-frequency transmission line according to claim 1, wherein, the interlayer transmission region is annular shaped and disposed around the signal via along a direction perpendicular to the layer stacking direction, and the multilayer substrate includes, in an inner layer, a plurality of conductive patterns coupled to at least one of the signal via and the plurality of ground vias and causes a width of the interlayer transmission region to be small.

3. The high-frequency transmission line according to claim 2, wherein the Rd conductive patterns are disposed at intervals of ¼ or less of a wavelength of the high-frequency signal propagating through the interlayer transmission region in the layer stacking direction.

4. The high-frequency transmission line according to claim 2, wherein the Rd conductive patterns are formed together with the at least one ground plane in pattern layers disposed between the plurality of dielectric layers.

5. The high-frequency transmission line according to claim 1, wherein, the at least one ground plane comprising a plurality of ground planes, the plurality of dielectric layers comprising three or more dielectric layers, the multilayer substrate includes the plurality of dielectric layers and the plurality of ground planes, and the plurality of ground vias includes interlayer vias penetrating through at least one of the plurality of dielectric layers excluding dielectric layers on which the signal lines are formed, among the three or more of the dielectric layers, and electrically coupled to the plurality of ground planes in contact with a portion of the three or more of the dielectric layers.

6. The high-frequency transmission line according to claim 5, wherein the interlayer vias each have a dimension that causes a first electric field and a second electric field to mutually cancel, the first electric field comprising a leakage electric field leaking from the interlayer transmission region toward the interlayer vias and traveling between the interlayer vias and the at least one ground plane, and the second electric field comprising a leakage electric field leaking from the interlayer transmission region toward the interlayer vias and entering into the interlayer vias.

7. The high-frequency transmission line according to claim 6, wherein the interlayer vias each has a height that is ¼ of a wavelength of the high-frequency signal in the interlayer transmission region and a width that is ½ of the wavelength of the high-frequency signal propagating through the interlayer transmission region in a cross-section passing through the center of the signal via and the center of the corresponding interlayer via.

8. The high-frequency transmission line according to claim 1, wherein the high-frequency transmission line includes a quasi coaxial line, and wherein the via diameter of the signal via that causes a connecting portion of multi mode propagation of the high-frequency signal in the interlayer transmission region satisfies $$f_c < \frac{c}{\pi\sqrt{\varepsilon_r}\dfrac{D+d}{2}} \quad \text{[Expression 1]}$$

where d is an outer diameter of an internal conductor of the interlayer transmission line, D is an inner diameter of an external conductor of the interlayer transmission line, $\varepsilon_r$ is a relative permittivity of a dielectric body disposed between the internal conductor and the external conductor, c is the speed of light, and fc is a critical frequency of a coaxial line, and wherein the coaxial line corresponds to the quasi coaxial line including the signal via serving as the internal conductor and the plurality of ground vias serving as the external conductor, in the high-frequency transmission line.

9. A high-frequency transmission line, comprising:
a multilayer substrate including a plurality of dielectric layers stacked on each other;
signal lines formed on two outer faces of the multilayer substrate;
a signal via coupling the signal lines formed on the two outer faces;
at least one ground plane disposed between the plurality of dielectric layers, included in the multilayer substrate, and surrounding a removed region disposed around the signal via; and
a plurality of ground vias penetrating at least one of the plurality of dielectric layers in a layer stacking direction, surrounding the signal via, and electrically coupled to the at least one ground plane,
wherein,
an interlayer transmission region is defined by the signal via and the plurality of ground vias, within which a high-frequency signal is transmitted in the layer stacking direction through the interlayer transmission region,
a via diameter of the signal via is set to a dimension that causes multi mode propagation of the high-frequency signal in the interlayer transmission region, and, while causing the multi mode propagation, the high-frequency signal forms a high-intensity region having a high intensity electric field in a transmission direction and a low-intensity region having a low intensity electric field in the transmission direction,
at least one of an inter-via distance between the signal via and each of the plurality of ground vias, the via diameter, and a substrate thickness of the multilayer substrate is set to couple the high-frequency signal from the interlayer transmission region, in which the high-intensity region of the multi mode propagation is formed, to the signal lines,
the at least one ground plane comprising a plurality of ground planes,
the plurality of dielectric layers comprising three or more dielectric layers,
the multilayer substrate includes the plurality of dielectric layers and the plurality of ground planes,
the plurality of ground vias includes interlayer vias penetrating through at least one of the plurality of dielectric layers excluding dielectric layers on which the signal lines are formed, among the three or more of the dielectric layers, and electrically coupled to the plurality of ground planes in contact with a portion of the three or more of the dielectric layers, and
the interlayer vias each have a dimension that causes a first electric field and a second electric field to mutually cancel, the first electric field comprising a leakage electric field leaking from the interlayer transmission region toward the interlayer vias and traveling between the interlayer vias and the at least one ground plane, and the second electric field comprising a leakage electric field leaking from the interlayer transmission region toward the interlayer vias and entering into the interlayer vias.

10. A high-frequency transmission line, comprising:
a multilayer substrate including a plurality of dielectric layers stacked on each other;
signal lines formed on two outer faces of the multilayer substrate;
a signal via coupling the signal lines formed on the two outer faces;
at least one ground plane disposed between the plurality of dielectric layers, included in the multilayer substrate, and surrounding a removed region disposed around the signal via; and
a plurality of ground vias penetrating at least one of the plurality of dielectric layers in a layer stacking direction, surrounding the signal via, and electrically coupled to the at least one ground plane,
wherein,
an interlayer transmission region is defined by the signal via and the plurality of ground vias, within which a high-frequency signal is transmitted in the layer stacking direction through the interlayer transmission region,
a via diameter of the signal via is set to a dimension that causes multi mode propagation of the high-frequency signal in the interlayer transmission region, and, while causing the multi mode propagation, the high-frequency signal forms a high-intensity region having a high intensity electric field in a transmission direction and a low-intensity region having a low intensity electric field in the transmission direction,
at least one of an inter-via distance between the signal via and each of the plurality of ground vias, the via diameter, and a substrate thickness of the multilayer substrate is set to couple the high-frequency signal from the interlayer transmission region, in which the high-intensity region of the multi mode propagation is formed, to the signal lines,
the via diameter of the signal via that causes the multi mode propagation of the high-frequency signal through the interlayer transmission region satisfies $$f_c < \frac{c}{\pi\sqrt{\varepsilon_r}\frac{D+d}{2}} \quad \text{[Expression 1]}$$

where d is an outer diameter of an internal conductor of the interlayer transmission region, D is an inner diameter of an external conductor of the interlayer transmission region, $\varepsilon_r$ is a relative permittivity of a dielectric body disposed between the internal conductor and the external conductor, c is the speed of light, and fc is a critical frequency of a coaxial line which corresponds to the high frequency transmission line, and
wherein
the coaxial line corresponds to a quasi coaxial line including the signal via serving as the internal conductor and the plurality of ground vias serving as the external conductor, in the high-frequency transmission line.

* * * * *